United States Patent
Petrick

(10) Patent No.: US 9,713,156 B2
(45) Date of Patent: *Jul. 18, 2017

(54) BEAM FORMING COMMUNICATION SYSTEM

(71) Applicant: Dell Products L.P., Round Rock, TX (US)

(72) Inventor: Christopher Stephen Petrick, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/280,553

(22) Filed: Sep. 29, 2016

(65) Prior Publication Data

US 2017/0086182 A1    Mar. 23, 2017

Related U.S. Application Data

(63) Continuation of application No. 14/860,374, filed on Sep. 21, 2015, now Pat. No. 9,491,765.

(51) Int. Cl.
*H04B 7/00* (2006.01)
*H04W 72/04* (2009.01)
(Continued)

(52) U.S. Cl.
CPC ......... *H04W 72/046* (2013.01); *H04W 16/28* (2013.01); *H04W 72/085* (2013.01)

(58) Field of Classification Search
USPC .......... 455/41.1–41.3, 522, 69–70, 507, 515, 455/450, 63.4
See application file for complete search history.

(56) References Cited

U.S. PATENT DOCUMENTS 8,208,386 B2    6/2012 Fowler et al.
8,614,954 B2    12/2013 McGee et al.
(Continued)

FOREIGN PATENT DOCUMENTS

WO    WO2014003499    1/2014

OTHER PUBLICATIONS

"Locate Oracle Sun Server Using Locator LED—Oracle Integrated Lights Out Manager (ILOM) 3.0 HTML Documentation Collection," Oracle, 2008, https://docs.oracle.com/cd/E19860-01/E21549/z40013e61440712.html.

(Continued)

*Primary Examiner* — Fayyaz Alam
(74) *Attorney, Agent, or Firm* — Haynes and Boone, LLP

(57) ABSTRACT

A beam forming communication system includes a beam forming wireless communication device that is configured to provide wireless communication signals on a plurality of beamed formed wireless communication paths. A plurality of computing devices are positioned in a rack and are each configured to receive wireless communication signals from the beam forming wireless communication device. Each of the plurality of computing devices may determine whether wireless communication signals satisfy minimum wireless signal characteristics and, if so, provide a beam form receiving indication. The plurality of computing devices are positioned such that only a first subset of the plurality of computing devices provide the beam form receiving indication in response to the beam forming wireless communication device providing the wireless communications signals on a first beam formed wireless communication path.

20 Claims, 15 Drawing Sheets

(51) Int. Cl.
*H04W 72/08* (2009.01)
*H04W 16/28* (2009.01)

(56) References Cited

U.S. PATENT DOCUMENTS

| | | | | |
|---|---|---|---|---|
| 8,897,184 | B2* | 11/2014 | Pettus | H04W 84/10 370/310 |
| 9,288,101 | B1* | 3/2016 | Dalal | H04L 47/193 |
| 2007/0076632 | A1 | 4/2007 | Ghamami | |
| 2012/0214415 | A1* | 8/2012 | Harvey | H05K 7/1425 455/41.2 |
| 2013/0089000 | A1 | 4/2013 | Hansen et al. | |
| 2013/0310058 | A1* | 11/2013 | Ibrahim | H04W 72/082 455/452.1 |
| 2014/0010319 | A1 | 1/2014 | Baik et al. | |
| 2015/0080039 | A1* | 3/2015 | Ling | H04W 52/02 455/500 |

OTHER PUBLICATIONS

Bhama Vemuru, "Transmit Smart With Transmit Beamforming," Marvell White Paper, Nov. 2011, pp. 1-8, Marvell Semiconductor, Inc., www.marvell.com.

"Chapter 4. Beamforming in 802.11ac," 802.11ac: A Survival Guide, 2013, pp. 1-23, Chapter 4, O'Reilly Media, Inc., http://chimera.labs.oreilly.com/books/1234000001739/ch04.html.

* cited by examiner

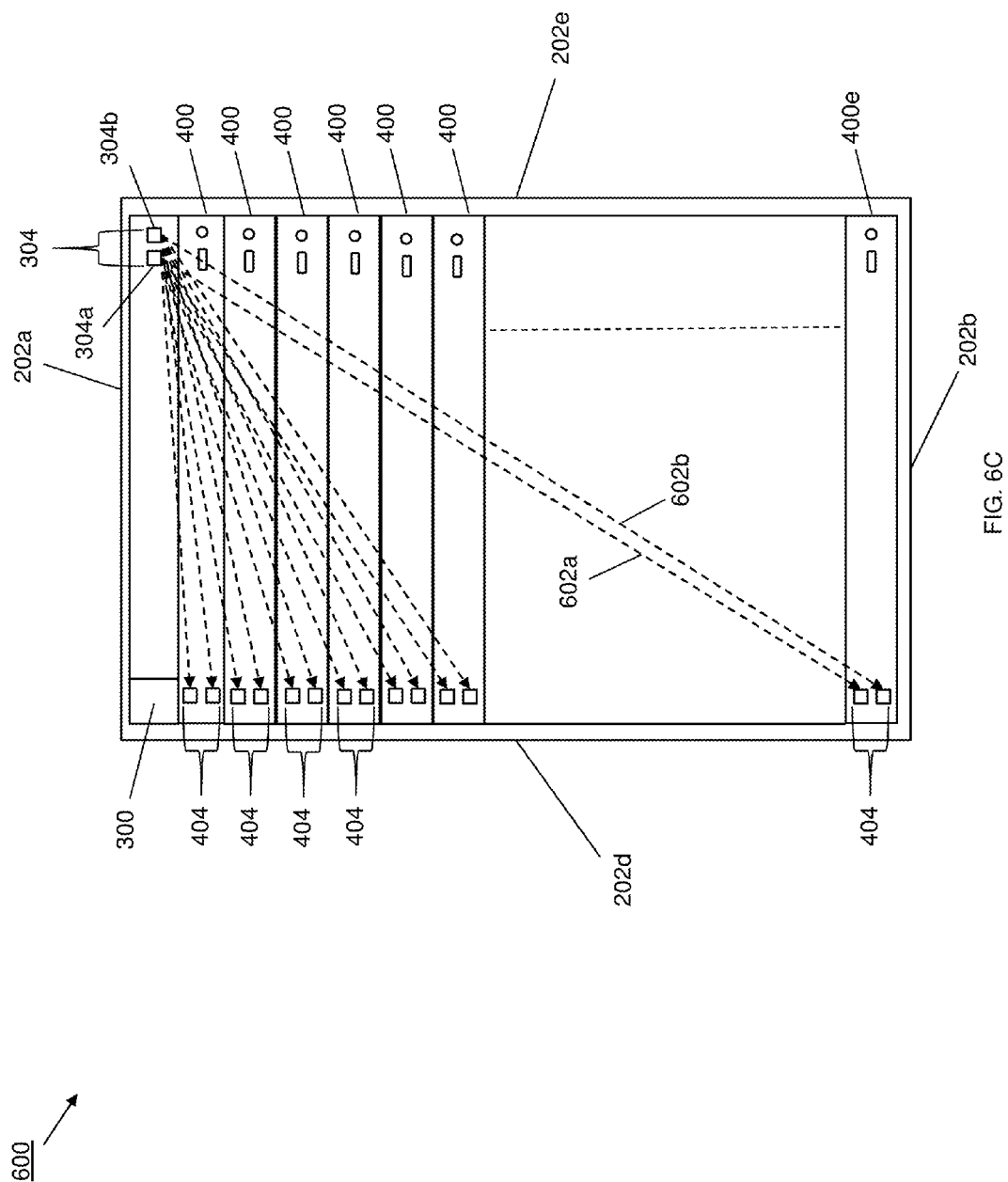

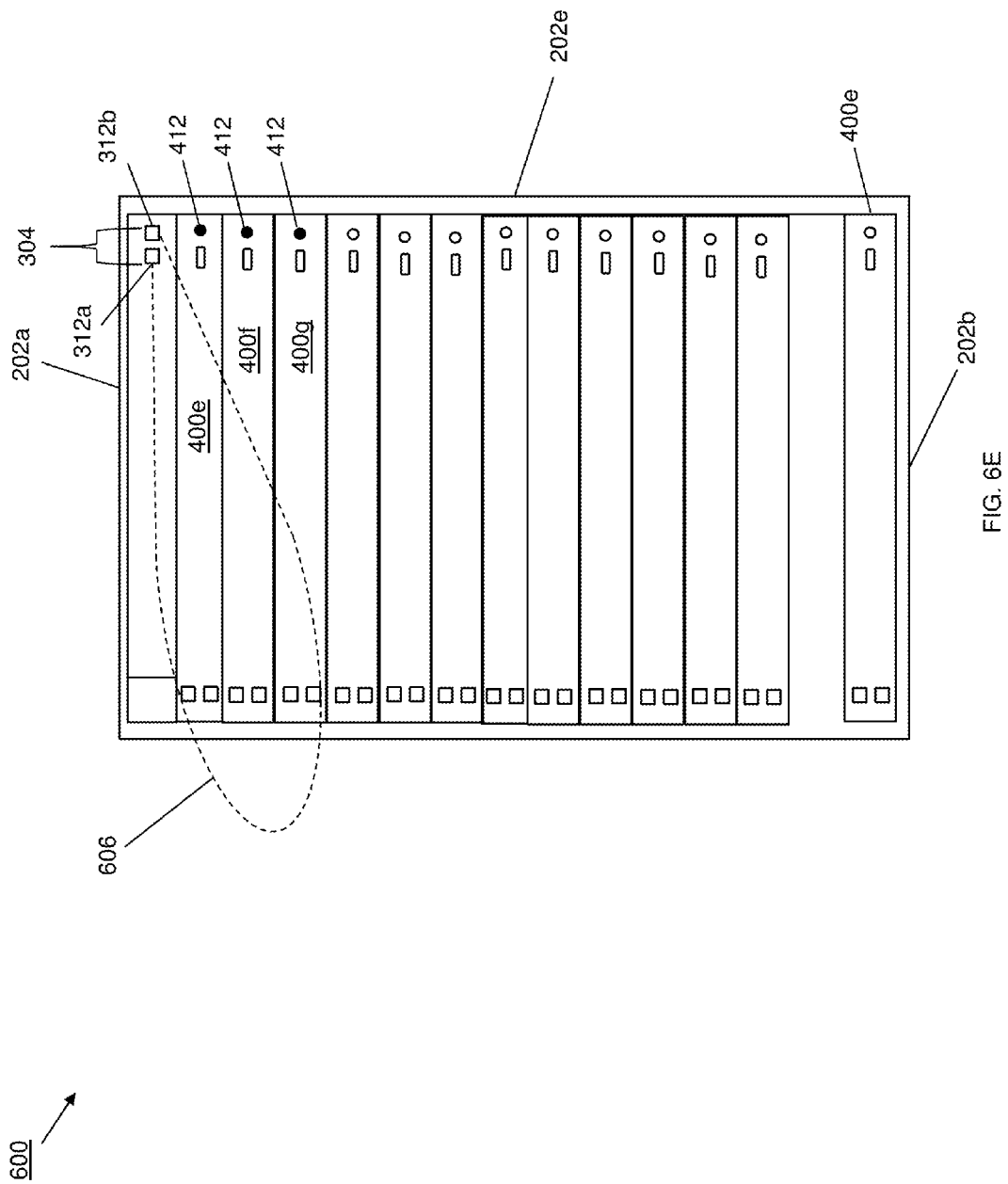

BEAM FORMING COMMUNICATION SYSTEM

CROSS-REFERENCE TO RELATED APPLICATIONS

This is a Continuation application to U.S. Utility application Ser. No. 14/860,374 filed Sep. 21, 2015, entitled "BEAM FORMING COMMUNICATION SYSTEM," the disclosure of which is incorporated herein by reference in its entirety.

BACKGROUND

The present disclosure relates generally to information handling systems, and more particularly to a beam forming communication system for information handling systems As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, switches, servers, and storage devices, are sometimes positioned in racks and connected together in order to provide a datacenter. For example, a plurality of servers may be connected to a Top Of Rack (TOR) switch that is connected to a network, and the TOR switch may route data from the network and to the servers, from the servers and to the network, as well as between different components in the rack. The servers and TOR switches are typically connected together using conventional cabling such as, for example, Ethernet cables that are configured to transmit the data between the TOR switch and the servers. However, because racks can hold dozens of servers, the connection of between those servers and the TOR switch requires many cables that must be routed through the rack, and that cabling can become cumbersome, obstructing access to the TOR switch, servers, and/or other features of the rack. It is desirable to eliminate the use of conventional cables in connecting devices in a rack, but the use of wireless communication raises a number of issues. For example, it may be difficult to provide wireless communications to devices in a rack and/or between devices in one or more racks that will enable the high speed communications necessary for the desired level of functionality of those devices.

Accordingly, it would be desirable to provide a wireless communication system within and between rack devices.

SUMMARY

According to one embodiment, an information handling system (IHS) includes a wireless communication subsystem; a processing system that is coupled to the wireless communication subsystem; and a memory system that is coupled to the processing system and that includes instructions that, when executed by the processing system, cause the processing system to provide a wireless communication engine that is configured to: receive wireless communication signals through the wireless communication subsystem from a beam forming wireless communication device; determine whether the wireless communication signals satisfy at least one minimum wireless signal characteristic; provide a beam form receiving indication in response to determining that the at least one minimum wireless signal characteristic of the wireless communication signals has been satisfied; and send a request through the wireless communication subsystem to the beam forming wireless communication device to provide the wireless signals on a different beam formed wireless communication path in response to determining that the at least one minimum wireless signal characteristic of the wireless communication signals has not been satisfied.

BRIEF DESCRIPTION OF THE DRAWINGS

FIG. 6C is a front view illustrating an embodiment of communications between the networking device and the server devices in the rack of FIG. 6B.

FIG. 6E is a front view illustrating an embodiment of a beam formed wireless communication path provided by the networking device to some of the server devices in the rack of FIG. 6C.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
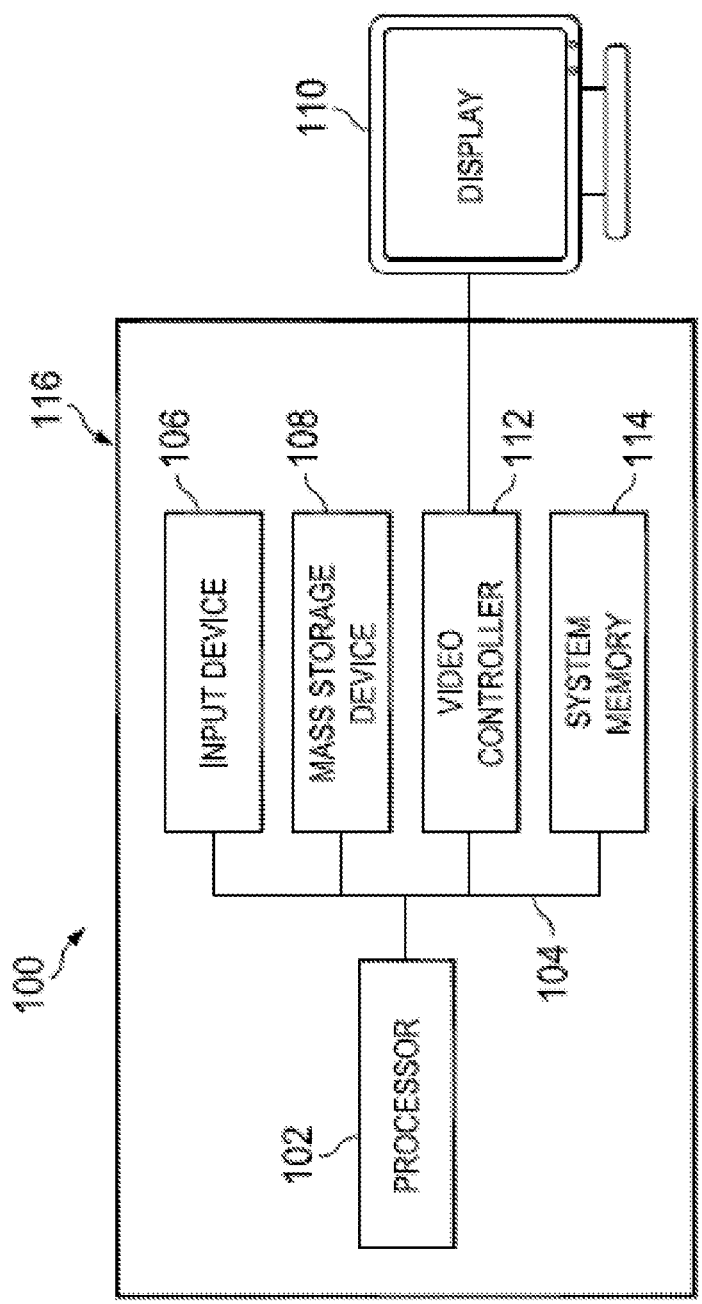
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
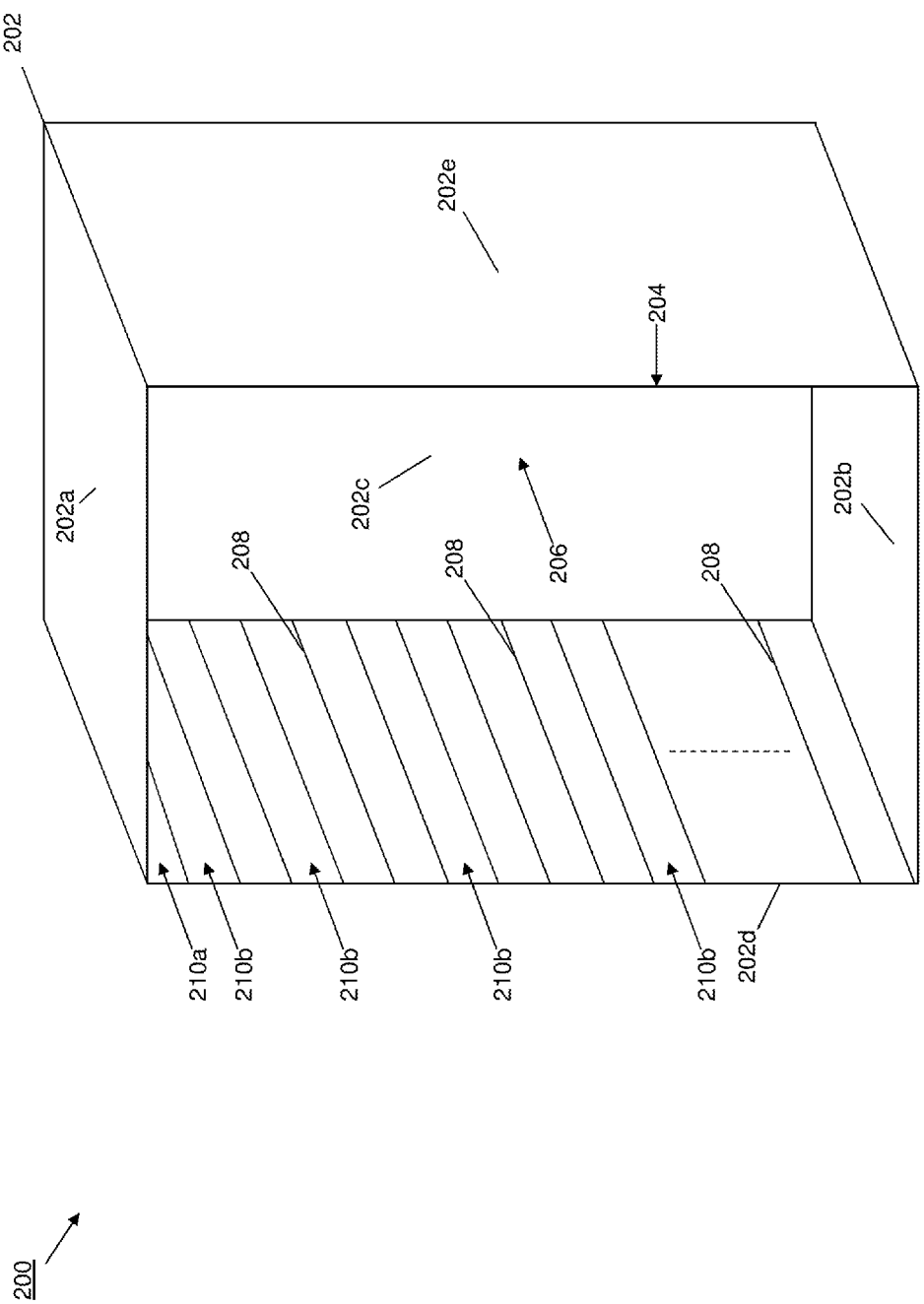
FIG. 2 is a perspective view illustrating an embodiment of a rack.

Referring now to FIG. 2, an embodiment of a rack 200 is illustrated. The rack 200 is illustrated and described below as a conventional datacenter rack that houses a plurality of server devices and a networking device (e.g., a TOR switch) in a vertical (e.g., one-on-top-of-the-other) orientation. However, one of skill in the art in possession of the present disclosure will recognize that the teachings of the present disclosure may be applied to different types of racks used in different situations (e.g., other than datacenters) and that house other types of devices (e.g., storage devices) in any of a variety of orientations (e.g., a horizontal/side-by-side orientation). The rack 200 includes a rack base 202 having a top wall 202a, a bottom wall 202b that is located opposite the rack base 202 from the top wall 202a, a rear wall 202c that extends between the top wall 202a and the bottom wall 202b, and a pair of side walls 202d and 202e that are located on opposite sides of the rack base 202 and that extend between the top wall 202a, the bottom wall 202b, and the rear wall 202c. While illustrated and described as "walls" for clarity, one of skill in the art in possession of the present disclosure will recognize that any or all of the top wall 202a, the bottom wall 202b, the rear wall 202c, and the side walls 202d and 202e may instead include framing, define channels, holes, or other apertures, and/or may otherwise include different structures that provide the rack 200 while remaining within the scope of the present disclosure. The edges of the top wall 202a, the bottom wall 202b, and the side walls 202d and 202e that are opposite the rear wall 202c define a rack entrance 204 that provides access to a rack housing 206 that is defined between the top wall 202a, the bottom wall 202b, the rear wall 202c, and the side walls 202d and 202e. In the embodiment of FIG. 2, the rack entrance 204 is illustrated as open and allowing access to the rack housing 206. However, in other embodiments, the rack 200 may include a door that is configured to close over the rack entrance 204 and control access to the rack housing 206 (e.g., in a cooled rack). As such, in some embodiments the rack entrance 204 may provide a design limit with regard to devices positioned in the rack housing 206 (e.g., such that they may not extend past the rack housing 204), while in other embodiments, the rack entrance 204 may not introduce such design limits (or at least allow for the extension of devices past the rack housing 204).

As illustrated, the side wall 202d may include a plurality of device coupling features 208 that define a first device housing 210a and a plurality of second device housings 210b. While not illustrated, the side wall 202e may include similar device coupling features that operate to define the first device housing 210a and the second device housings 210b. In the embodiments discussed below, the first device housing 210a is described as being utilized in coupling a networking device to the rack 200, while the second device housings 210b are described as being utilized in coupling server devices to the rack 200. However, one of skill in the art in possession of the present disclosure will recognize that the first device housing 210a and the second device housings 210b may be substantially similar, and may be used to couple any of a variety of different devices to the rack 200. In specific embodiments discussed below, the rack 200 is described as a conventional 19-inch rack that is configured to house devices having widths of approximately 19 inches (e.g., as measured between the side walls 202d and 202e of the rack 200), and that includes a height of 42 rack units (42U) such that the rack 200 may include a networking device in the first device housing 210a and forty server devices in the second device housings 210b. However, the teachings of the present disclosure are not intended to be limited to this specific embodiment, and one of skill in the art will recognize that those teachings may be applied to "half-height" racks, horizontal racks, and/or other racks known in the art while remaining within the scope of the present disclosure.

Figure 3A:
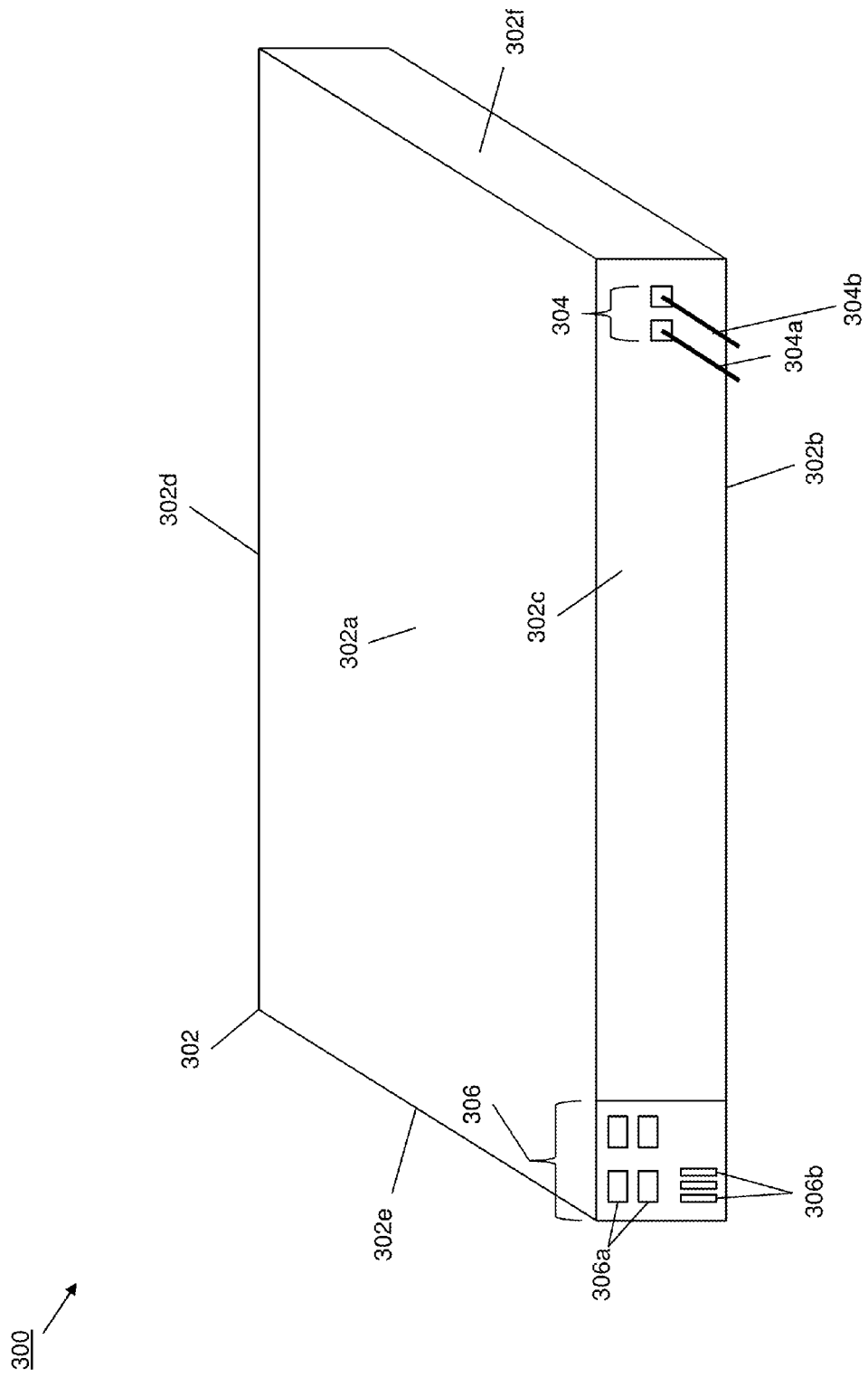
FIG. 3A is a perspective view illustrating an embodiment of a networking device.
Figure 3B:
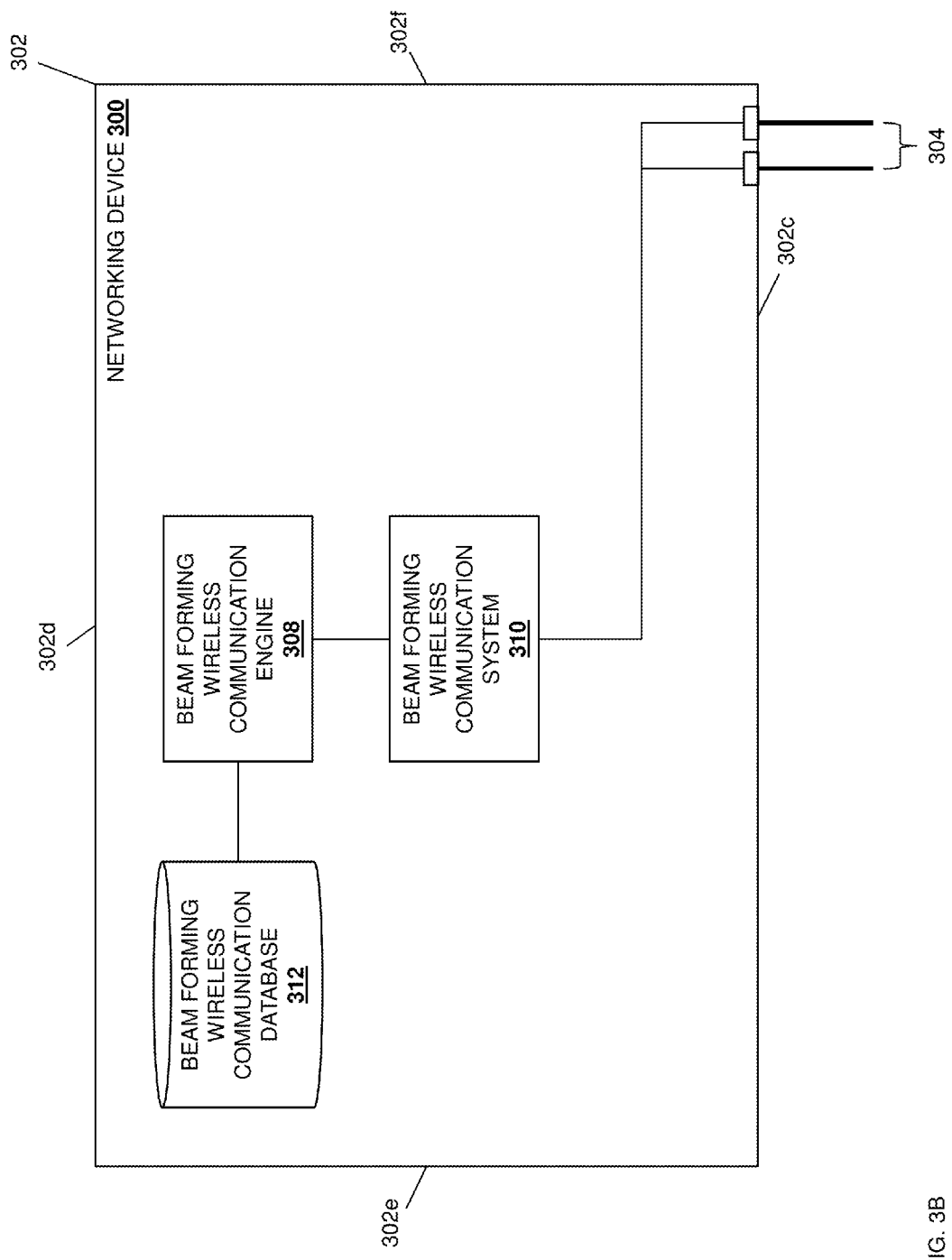
FIG. 3B is a schematic view illustrating an embodiment of the networking device of FIG. 3A.

Referring now to FIGS. 3A and 3B, an embodiment of a networking device 300 is illustrated. The networking device 300 may be the IHS 100 discussed above with reference to FIG. 1 and/or may include some or all of the components of the IHS 100. In a specific embodiment, the networking device 300 may be a Top Of Rack (TOR) switch. However, in other embodiments, the networking device 300 may be other types of switches (e.g., a Fibre Channel switch for a Storage Area Network (SAN)) and/or other types of rack devices while remaining within the scope of the present disclosure. The networking device 300 includes a chassis 302 having a top surface 302a, a bottom surface 302b that is located opposite the chassis 302 from the top surface 302a, a front surface 302c extending between the top surface 302a and the bottom surface 302b, a rear surface 302d located opposite the chassis 302 from the front surface 302c and extending between the top surface 302a and the bottom surface 302b, and a pair of side surfaces 302e and 302f located opposite the chassis 302 from each other and extending between the top surface 302a, the bottom surface 302b, the front surface 302c, and the rear surface 302d. While not illustrated, each of the side surfaces 302e and 302f (as well as other surfaces) on the networking device 300 may include rack engagement features for engaging the device coupling features 208 on the rack 200 to couple the networking device 300 to the rack 200.

In the embodiments discussed below, the front surface 302c of the networking device 300 includes a single antenna system 304 that extends from the front surface 302c. However, different numbers of antenna systems may be provided with the networking device 300 that operate in the manner discussed below for the antenna system 304 while remaining within the scope of the present disclosure. For example, the antenna system 304 may include a smart antenna system, a multiple-input and multiple-output (MIMO) antenna system, a phased array antenna system, and/or a variety of other antenna systems known in the art. In the illustrated embodiment, the antenna system 304 includes a pair of antennas (e.g., antennas 304a and 304b). However, different numbers of antennas (e.g., a single antenna, more than two antennas, etc.) will fall within the scope of the present disclosure. In a specific embodiment, the antennas in the antenna system 304 may be provided by 802.11ad transmitters and/or receivers (e.g., the antenna 304a in the antenna system 304 may be provided as a transmitter, while the antenna 304b in the antenna system 304 may be provided as a receiver). However, other wireless standards used for internetworking devices may be utilized in the networking device such as, for example, 802.11n, 802.11ac, 802.11ay, Wideband Code Division Multiple Access, 3GPP Long Term Evolution (LTE), etc. While each of the antennas 340a and 304b in the antenna system 304 are illustrated with straight lines, one of skill in the art in possession of the present disclosure will recognize that antenna(s) used in antenna systems may include a three-dimensional shape/configuration that provides a width and height (as well as the length that is illustrated). For example, the antennas 304a and 304b used for the antenna system 304 may include a width of approximately 5 millimeters and a height of approximately 1-2 millimeters.

In the embodiments discussed below, the antennas 304a and 304b in the antenna system 304 are an integrated component of the networking device 300 such that they are not configured to be removed from the front surface 302c of the chassis 302. However, in some embodiments, the antennas 304a and 304b for the antenna system 304 may be configured to be coupled to and decoupled from the networking device 300. For example, the antennas for the antenna system 304 may be configured to couple to Ethernet ports, Fibre Channel ports, Serial Attached Small Computer System Interface (SCSI) (SAS) ports, Infiniband ports, Universal Serial Bus (USB) ports, and/or other ports on the networking device 300 while remaining within the scope of the present disclosure. In some of those examples, the antennas for the antenna system 304 may couple to conventional Ethernet ports on a structurally conventional networking device (that includes the wireless communication engines taught by the present disclosure) if the configuration of those Ethernet ports is sufficient to provide the wireless communication functionality discussed below. However, in other examples, the networking device 300 may be configured with Ethernet ports according to the teachings below in order to provide the wireless communication functionality discussed below. Thus, one of skill in the art in possession of the present disclosure will recognize that the provisioning of antennas on the networking device 300 to provide the wireless communication functionality discussed below will depend on the configuration of the system (i.e., the rack, the devices in the rack, etc.), and a wide variety of different antenna systems (integrated, port-coupled, combinations thereof, etc.) will fall within the scope of the present disclosure.

The networking device 300 may also include a variety of other networking device features, only some of which are illustrated in FIGS. 3A and 3B. For example, a management port area 306 may be provided on the front surface 302c. In the illustrated embodiment, the management port area 306 includes a plurality of management Ethernet ports 306a and a plurality of management Universal Serial Bus (USB) ports 306b, but one of skill in the art in possession of the present disclosure will recognize that a variety of other management ports and/or management features may be provided in the management port area 306 (e.g., including but not limited to 802.11 functionality, Bluetooth functionality, Near Field Communications functionality) while remaining within the scope of the present disclosure. Furthermore, the management port area 306 is provided at a location on the front surface 302c of the networking device 300 that is adjacent the side surface 302e based, at least on part, in the configuration of the rack 200 in order to provide the beam formed wireless communication paths discussed below, and the location of the management port area 306 may be moved based on different rack configurations to provide different beam formed wireless communication paths as desired or required by the rack configuration.

While not illustrated, one of skill in the art in possession of the present disclosure will recognize that a plurality of networking ports (e.g., Ethernet ports, switch uplink ports, Fibre Channel ports, SAS ports, Peripheral Component Interconnect Express (PCIE) ports, Infiniband ports, USB ports, High Speed Serial ports, etc.) may be provided on the front surface 302c of the networking device 300 between the antenna system 304 and the top surface 302a. Similarly as with the management port area 306, the networking ports may be provided on the front surface 302c of the networking device 300 based, at least on part, in the configuration of the rack 200 in order allow for the provision of the beam formed wireless communication paths discussed below, and the location of the networking ports may be moved based on different rack configurations to provide different beam formed wireless communication paths as desired or required by the rack configuration. In the specific embodiment illustrated in FIG. 3A, no ports or other obstructions are provided on the front surface 302c between the antenna system 304 and the bottom surface 302b of the chassis 302 in order to allow for the beam formed wireless communication paths discussed below. However, one of skill in the art in possession of the present disclosure will recognize how the networking device 300 may be modified to operate as discussed below when used with the rack in different configurations (e.g., by providing an unobstructed front surface 302c between the antenna systems 304 and the top surface 302a when the networking device 300 is positioned in the bottom of the rack 200).

Referring now to FIG. 3B, the chassis 302 of the networking device 300 may house a processing system (not illustrated, but which may be the processor 102 discussed above with reference to FIG. 1) and a memory system (not illustrated, but which may be the system memory 114 discussed above with reference to FIG. 1) that includes instructions that, when executed by the processing system, cause the processing system to provide a beam forming wireless communication engine 308 that is configured to perform the functions of the beam forming wireless communication engines and networking devices discussed below. The beam forming wireless communication engine 308 is coupled to a beam forming wireless communication system 310 (e.g., via a coupling between the processing system and the beam forming wireless communication system 310) that is coupled to the antenna system 304. In different embodiments, the beam forming wireless communication system 310 may be any of a variety of beam forming wireless communication systems known in the art. As discussed below, the beam forming wireless communication system 310 may be configured to use the antenna system 304 to perform spatial filtering, beam forming, and/or other signal processing techniques that provide for directional signal transmission and/or reception. For example, the beam forming wireless communication system 310 may combine elements in a phased array such that particular signals at particular angles experience constructive interference while other signals at other angles experience destructive interference. However, one of skill in the art in possession of the present disclosure will recognize that other beam forming wireless communication techniques will fall within the scope of the present disclosure. The beam forming wireless communication engine 308 is also coupled to a storage device (not illustrated, but which may be the storage device 108, discussed above with reference to FIG. 1, that is coupled to the processing system) that includes a beam forming wireless communication database 312.

While in the embodiments discussed below, the networking device 300 is provided as a beam forming wireless communication device that performs the beam forming of the present disclosure while positioned in a device housing in the rack 200, other beam forming wireless communication devices may be provided in place of the networking device 300 while remaining within the scope of the present disclosure. For example, devices such as beacon devices, wireless router devices, and/or other wireless communications system may be enabled to perform beam forming and may be positioned at other locations on and/or adjacent the rack 200 while remaining within the scope of the present disclosure. As such, the beam forming wireless communication device(s) of the present disclosure may be positioned on the rack 200 (e.g., on the top surface 202a), adjacent the rack 200 (e.g., on a wall, ceiling, or floor adjacent the rack 200), and/or in a variety of other locations that would allow for the beam formed wireless communication paths discussed below and that would be apparent to one of the skill in the art in possession of the present disclosure.

Figure 4A:
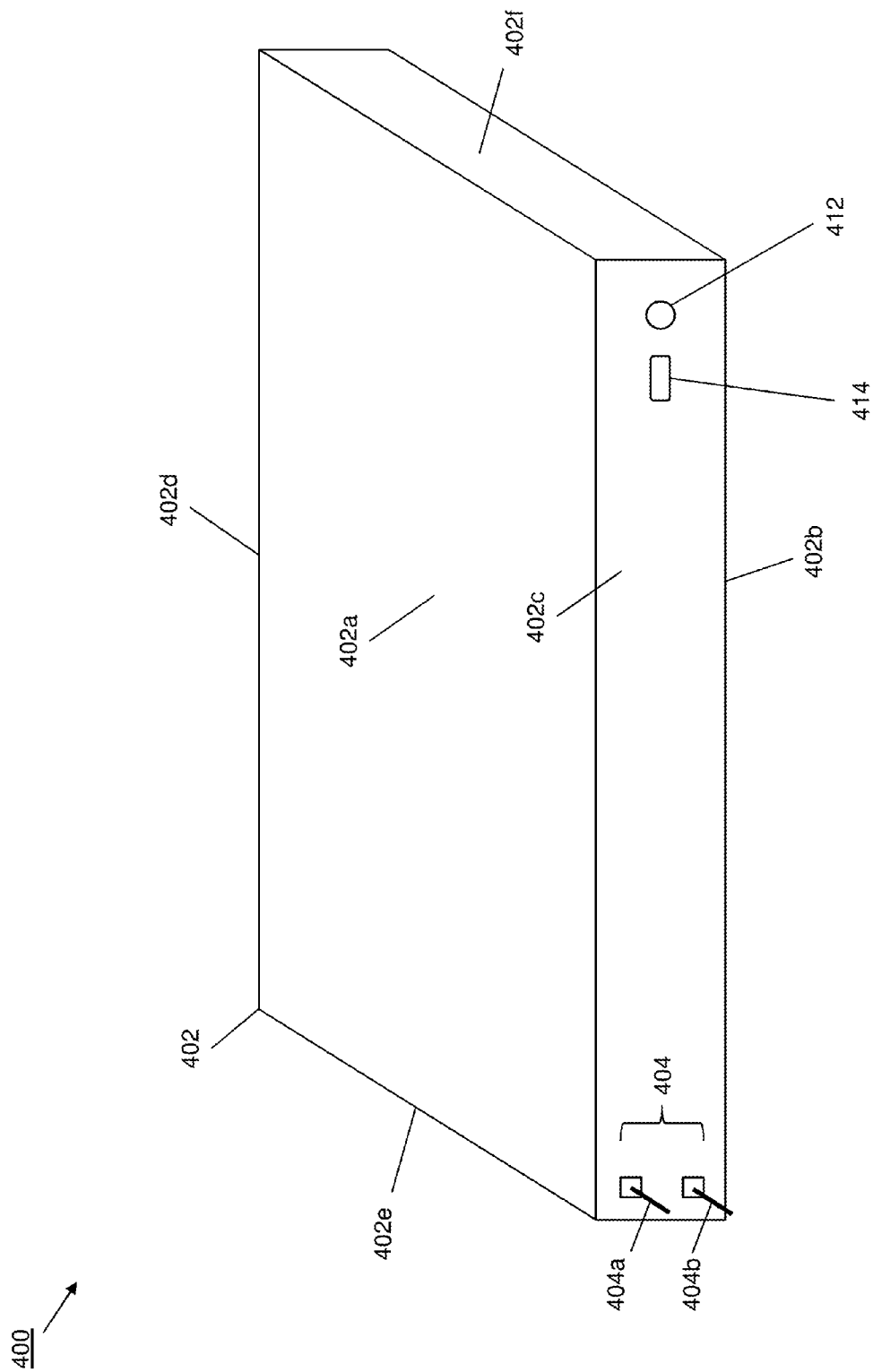
FIG. 4A is a perspective view illustrating an embodiment of a server device.
Figure 4B:
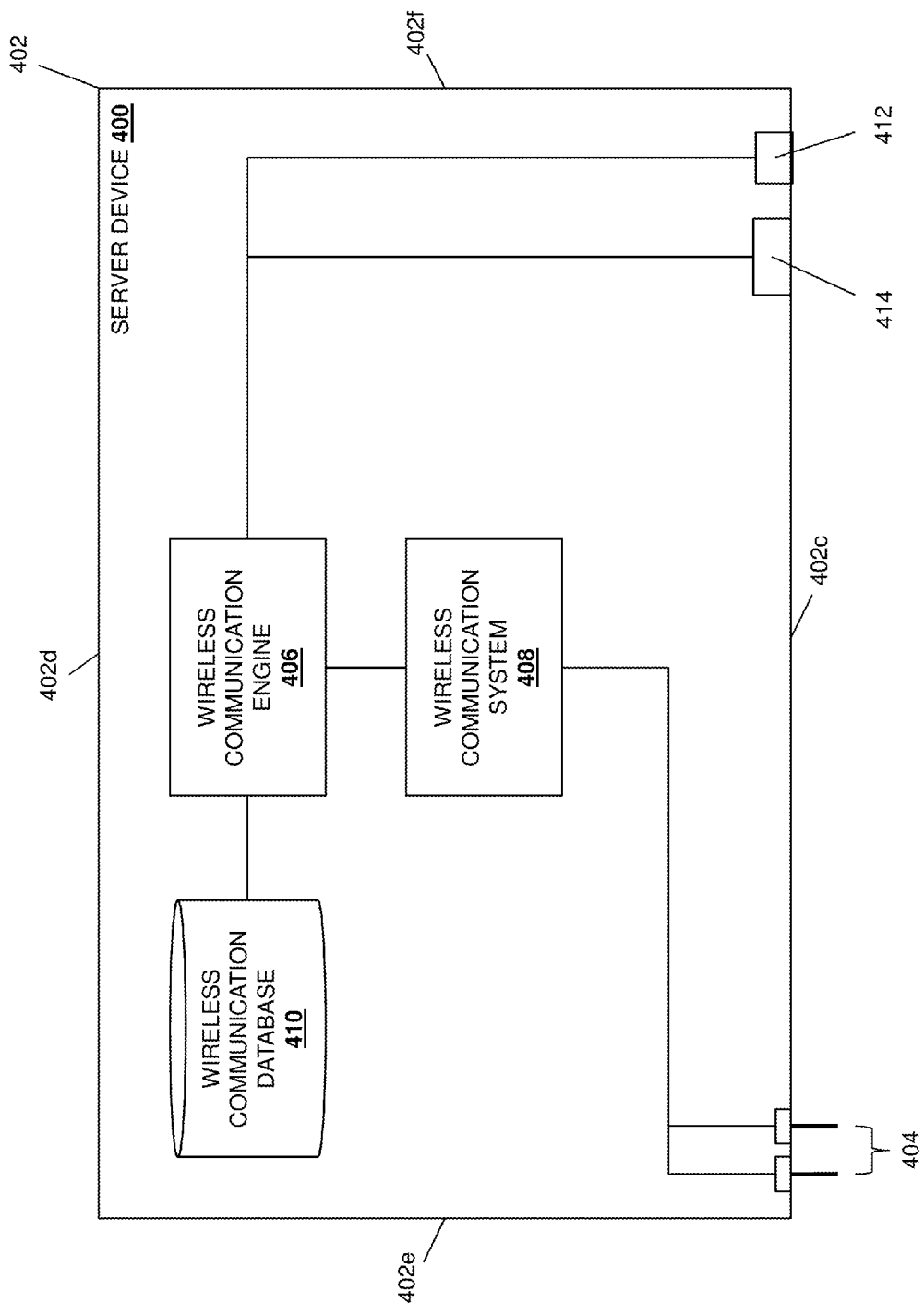
FIG. 4B is a schematic view illustrating an embodiment of the server device of FIG. 4A

Referring now to FIGS. 4A and 4B, an embodiment of a server device 400 is illustrated. The server device 400 may be the IHS 100 discussed above with reference to FIG. 1 and/or may include some or all of the components of the IHS 100. In specific embodiments discussed below, the server device 400 is illustrated and described as a data center server that provides the computing device that utilizes the beam formed wireless communication paths discussed herein. However, in other embodiments the computing device of the present disclosure may be provided instead by storage devices in a Storage Area Network (SAN)) and/or other types of rack devices while remaining within the scope of the present disclosure. The server device 400 includes a chassis 402 having a top surface 402a, a bottom surface 402b that is located opposite the chassis 402 from the top surface 402a, a front surface 402c extending between the top surface 402a and the bottom surface 402b, a rear surface 402d located opposite the chassis 402 from the front surface 402c and extending between the top surface 402a and the bottom surface 402b, and a pair of side surfaces 402e and 402f located opposite the chassis 402 from each other and extending between the top surface 402a, the bottom surface 402b, the front surface 402c, and the rear surface 402d. While not illustrated, each of the side surfaces 402e and 402f (as well as other surfaces) on the server device 400 may include rack coupling features for engaging the device coupling features 208 on the rack 200 to couple the server device 400 to the rack 200.

In the embodiments discussed below, the front surface 402c of the server device 400 includes an antenna system 404 that extends from the front surface 402c at a location that is adjacent the side surface 402e. In the illustrated embodiment, the antenna system 404 includes a pair of antennas (e.g., antennas 404a and 404b). However, different numbers of antennas (e.g., a single antenna, more than two antennas, etc.) will fall within the scope of the present disclosure. In a specific example, the antennas 404a and 404b in the antenna system 404 may be provided by 802.11ad transmitters and/or receivers (e.g., the antenna 404a in the antenna system 404 may be provided as a transmitter, while the antenna 404b in that antenna system 404 may be provided as a receiver). However, other wireless standards used for internetworking devices may be utilized in the networking device such as, for example, 802.11n, 802.11ac, 802.11ay, Wideband Code Division Multiple Access, 3GPP Long Term Evolution (LTE), etc. While the antennas 404a and 404b in the antenna system 404 are illustrated with straight lines, one of skill in the art in possession of the present disclosure will recognize that antenna(s) used in antenna systems may include a three-dimensional shape/configuration that provides a width and height (as well as the length that is illustrated). For example, the antennas 404a and 404b used for the antenna system 404 may include a width of approximately 5 millimeters and a height of approximately 1-2 millimeters. In some embodiments, it may be desirable to minimize the width of antennas to ensure that no interference is introduced between adjacent antennas.

In the embodiments discussed below, the antennas 404a and 404b for the antenna system 404 are configured to be coupled to and decoupled from the server device 400. For example, the antennas 404a and 404b for the antenna system 404 may be the 802.11ad transmitters/receivers that are configured to couple to single or dual-Ethernet ports, Fibre Channel ports, SAS ports, PCIE ports, Infiniband ports, USB ports, and/or other ports on the server device 400. In other embodiments, the antenna system 404 may conform to wireless standards such as 802.11n, 802.11ac, 802.11ay, Wideband Code Division Multiple Access, 3GPP Long Term Evolution (LTE), etc. In some embodiments, the antennas 404a and 404b for the antenna system 404 may be coupled to conventional dual Ethernet ports on a structurally conventional server device (that includes the wireless communication engines taught by the present disclosure) to provide the wireless communication functionality discussed below. However, in other embodiments, the server device 400 may be configured with Ethernet ports according to the teachings below in order to provide the wireless communication functionality discussed below. Furthermore, in other embodiments, each of the antennas 404a and 404b in the antenna system 404 may be an integrated component of the server device 400 such that it is not configured to be removed from the front surface 402c of the chassis 402. Thus, one of skill in the art in possession of the present disclosure will recognize that the provisioning of antennas 404a and 404b on the server device 400 to provide the wireless communication functionality discussed below will depend on the configuration of the system (i.e., the rack, the devices in the rack, etc.), and a wide variety of different antenna systems (integrated, port-coupled, combinations thereof, etc.) will fall within the scope of the present disclosure.

Referring now to FIG. 4B, the chassis 402 of the server device 400 may house a processing system (not illustrated, but which may be the processor 102 discussed above with reference to FIG. 1) and a memory system (not illustrated, but which may be the system memory 114 discussed above with reference to FIG. 1) that includes instructions that, when executed by the processing system, cause the processing system to provide a wireless communication engine 406 that is configured to perform the functions of the wireless communication engines and server devices discussed below. The wireless communication engine 406 is coupled to a wireless communication system 408 (e.g., via a coupling between the processing system and the wireless communication system 408) that is coupled to the antenna system 404. In different embodiments, the wireless communication system 408 may be any of a variety of wireless communication systems known in the art. For example, as discussed below, the wireless communication system 408 may be configured to receive wireless communications via the antenna system 404. In an embodiment, the wireless communication system 404 may be provided as per the IEEE 802.11ad specification, the IEE 802.11n specification, the 802.11ac specification, the 802.11ay the specification, the Wideband Code Division Multiple Access specification, the 3GPP Long Term Evolution (LTE) specification, etc. However, one of skill in the art in possession of the present disclosure will recognize that other wireless communication techniques will fall within the scope of the present disclosure. The wireless communication engine 408 is also coupled to a storage device (not illustrated, but which may be the storage device 108, discussed above with reference to FIG. 1, that is coupled to the processing system) that includes a wireless communication database 410.

In an embodiment, a beam form receiving indicator 412 is coupled to the wireless communication engine 406 (e.g., via a coupling between the processing system and the beam form receiving indicator 412) and provided adjacent the front surface 402c of the chassis 402. In the embodiments discussed below, the beam form receiving indicator 412 is a light emitting device (LED) that is configured to be activated/illuminated by the wireless communication engine 406 to indicate the reception of wireless communication signals having minimum wireless signal characteristics. However, in other embodiments, the beam form receiving indicator 412 may include a variety of other indicator devices such as audio devices, video devices, information displays, and/or other indicators known in the art, and may provide indications of a variety of other information known in the art while remaining within the scope of the present disclosure. For example, a beam form receiving indicator may include a detached device connected wirelessly (e.g., via Bluetooth, Near Field Communications, etc.) to the system such as, for example, a tablet, mobile phone, or other wireless device, and the wireless communications engine 406 may communicate such that the detached device presents a beam forming receiving indicator on a LCD screen, speaker, LED or other indicator coupled to the detached device.

A beam form trainer 414 is coupled to the wireless communication engine 406 (e.g., via a coupling between the processing system and the beam form trainer 414) and provided adjacent the front surface 402c of the chassis 402. In the embodiments discussed below, the beam form trainer 414 is an physical input button that is configured to be actuated by a user/administrator to manually instruct the wireless communication engine 406 to request beam formed wireless communication path modification, discussed in further detail below. However, in other embodiments, the beam formed wireless communication path modifications may be initiated using a variety of other techniques while remaining within the scope of the present disclosure. Similarly as discussed above, a beam form trainer input may be detached device connected wirelessly (e.g., via Bluetooth, Near Field Communications, etc.) to the system such as, for example, a tablet, mobile phone, or other wireless device, and the available input options on the detached device may be configured to be actuated by a user/administrator to manually instruct the wireless communication engine 406 to request beam formed wireless communication path modification, discussed in further detail below.

Figure 5:
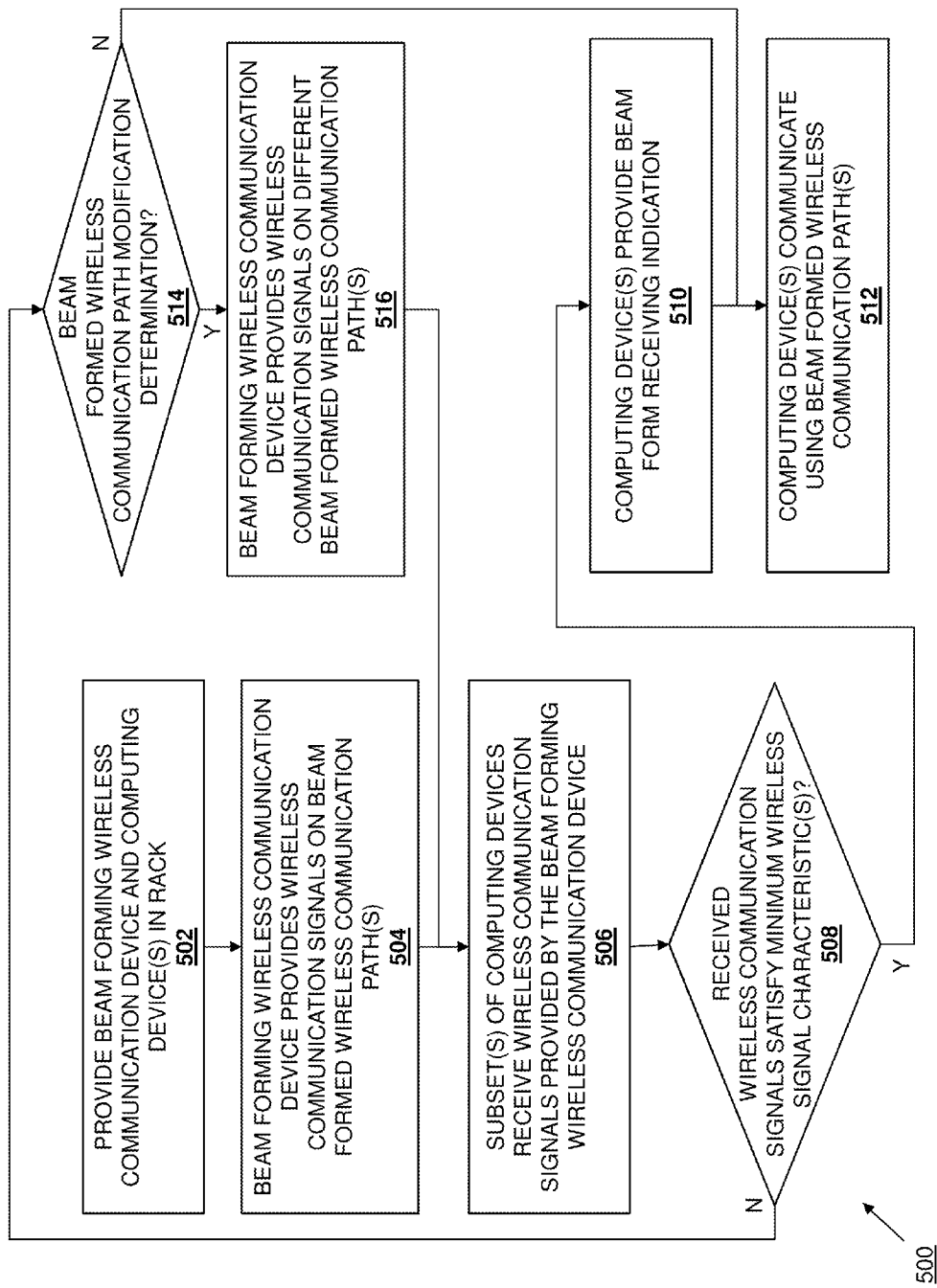
FIG. 5 is a flow chart illustrating an embodiment of a method for providing beam forming communications.

Referring now to FIG. 5, an embodiment of a method 500 for providing beam forming wireless communications is illustrated. As discussed in further detail below, the networking device 300 provides an embodiment of a beam forming wireless communication device that performs beam forming wireless communication techniques in order to direct beam formed wireless communication paths at subset(s) of server devices 400 positioned in a rack such that that those subset(s) of server devices will receive wireless communication signals that include at least minimum wireless signal characteristics. The server devices 400 in the rack may receive wireless communication signals from the networking device 300, determine whether they satisfy the minimum wireless signal characteristics and, if so, provide an indication (e.g., by activating a light emitting device) such that a user/administrator can confirm which server devices 400 in the rack are receiving a desirable quality wireless signal. If it is determined that some subset of the server devices 400 are receiving the wireless communications signals at less than at least one minimum wireless signal characteristic (or not receiving the wireless signals at all), the networking device 300 may be instructed to modify the beam formed wireless communication path(s) such that that subset of server devices 400 receive the wireless communication signals with the at least one minimum wireless signal characteristic. As such, beam formed wireless communication paths may be dynamically modified to enhance communications between server devices in a rack, between server devices in different racks, and/or in a variety of server device configurations known in the art.

Figure 6A:
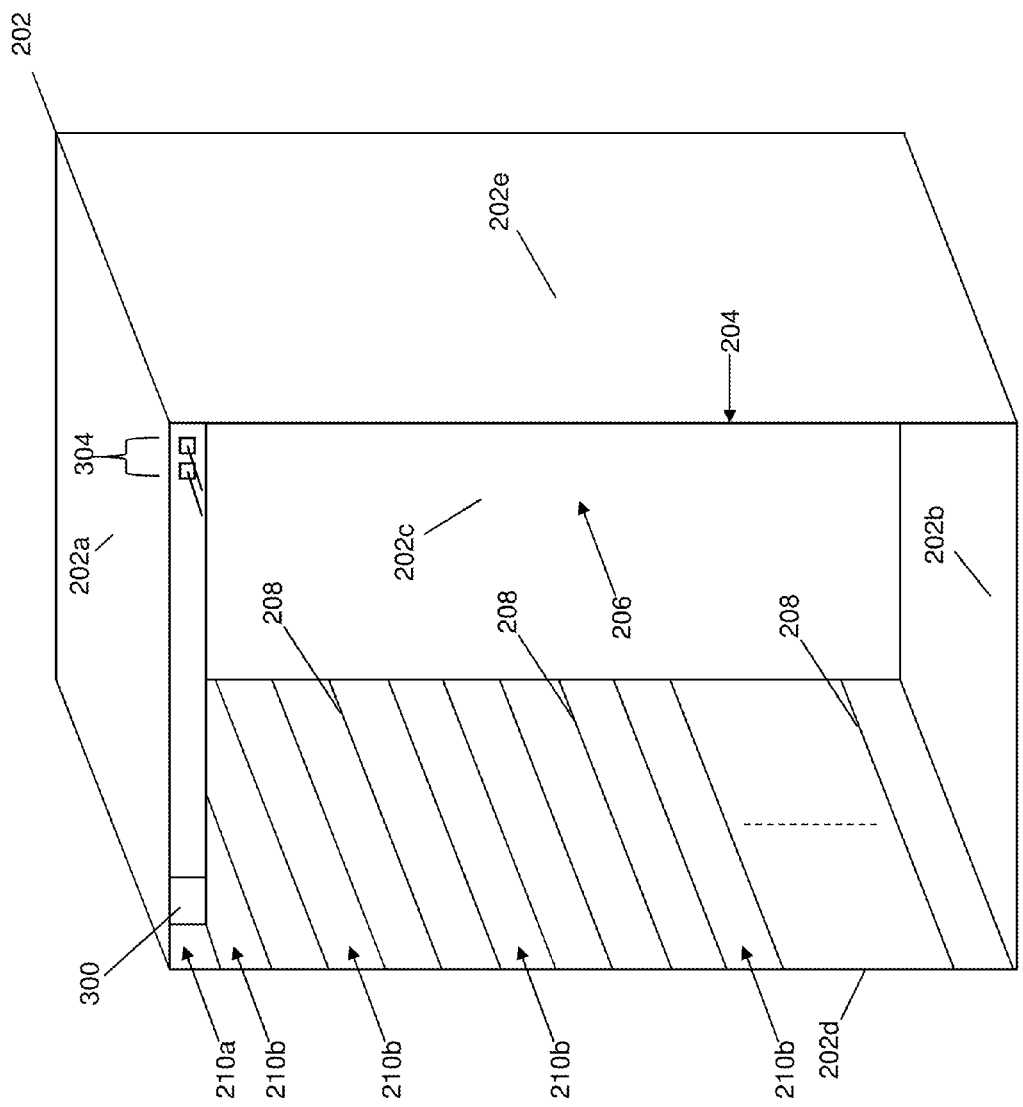
FIG. 6A is a perspective view illustrating an embodiment of the networking device of FIGS. 3A and 3B positioned in the rack of FIG. 2.

The method 500 begins at block 502 where a beam forming wireless communication device and computing device(s) are positioned in a rack. Referring now to FIG. 6A, in an embodiment of block 502, the rack 200 illustrated in FIG. 2 is provided, and the networking device 300 illustrated in FIGS. 3A and 3B is positioned in the first device housing 210a defined by the rack base 202. For example, the networking device 300 may be positioned adjacent the first device housing 210a on the rack 200 such that the rear surface 302d of the chassis 302 for the networking device 300 is aligned with the first device housing 210a, and then the networking device 300 is moved towards the rack 200 such that the chassis 302 of the networking device 300 enters the first device housing 210a and the rack coupling features on the side surfaces 302e and 302f of the chassis 302 engage the device coupling features 208 on the side walls 202d and 202e of the rack 200. The networking device 300 may then be moved through the first device housing 210a until the networking device 300 is fully positioned in the rack 200. FIG. 6A illustrates an embodiment of the networking device 300 fully positioned in the first device housing 210a. In that embodiment, the front surface 302c of the networking device 300 is spaced apart from the rack entrance 204 of the rack 200 such that the antennas 304a and 304b on the antenna system 304 do not extend past the rack entrance 204 of the rack 200. However, in some embodiments the extension of the antennas 304a and 304b in the antenna system 304 past the rack entrance 204 (e.g., by a longer antenna, by a cable that extends the antenna, etc.) will fall within the scope of the present disclosure.

Figure 6B:
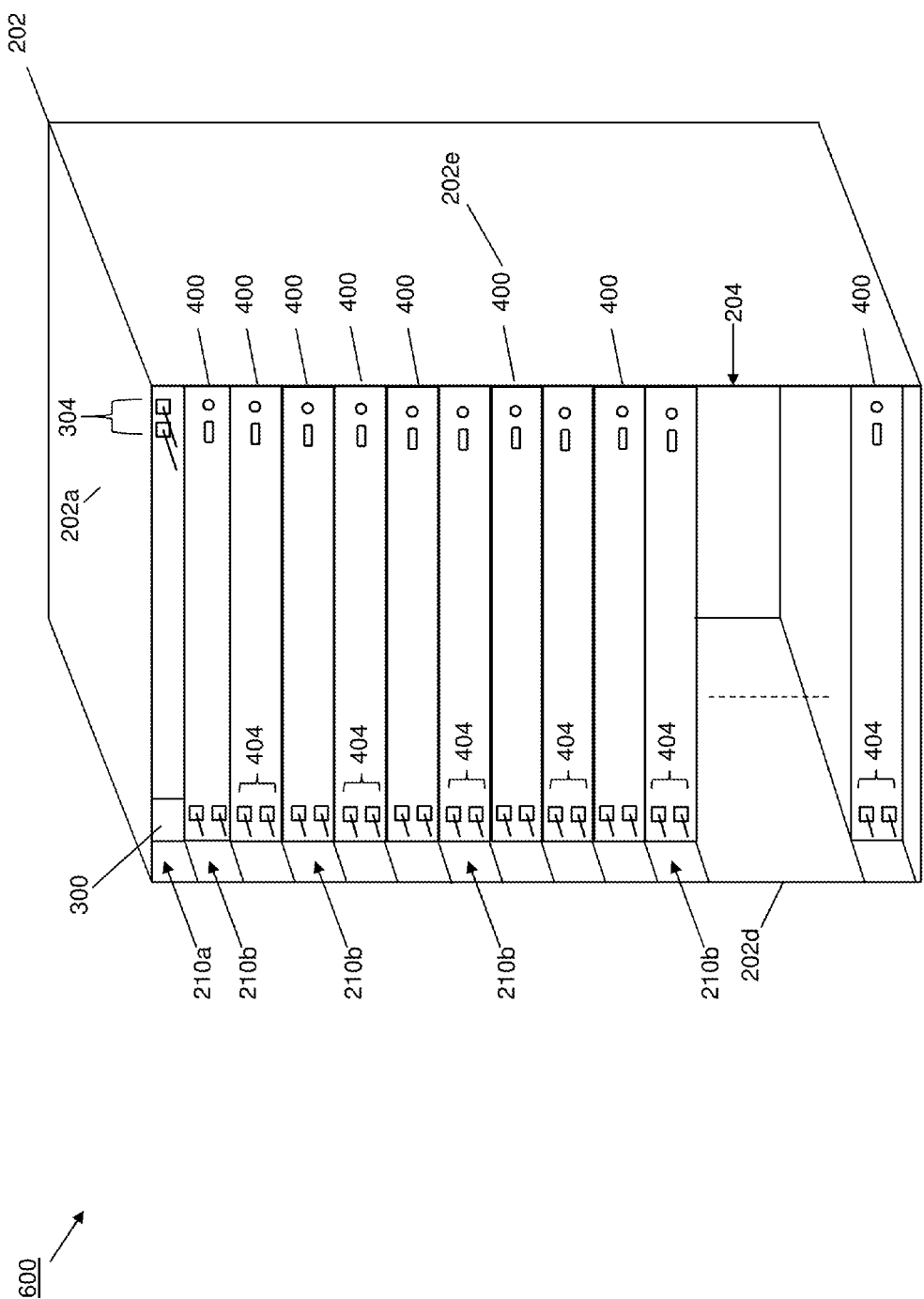
FIG. 6B is an embodiment of a plurality of the service devices of FIGS. 4A and 4B positioned in the rack of FIG. 2 with the networking device of FIGS. 3A and 3B.

Referring now to FIG. 6B, one of the server devices 400 illustrated in FIGS. 4A and 4B may be positioned in any or all of the second device housings 210b defined by the rack base 202. For example, a server device 400 may be positioned adjacent one of the second device housings 210b on the rack 200 such that the rear surface 402d of the chassis 402 for the server device 400 is aligned with that second device housing 210b, and then the server device 400 is moved towards the rack 200 such that the chassis 402 of the server device 400 enters that second device housing 210b and the rack coupling features on the side surfaces 402e and 402f of the chassis 402 engage the device coupling features 208 on the side walls 202d and 202e of the rack 200. The server device 400 may then be moved through the second device housing 210b until the server device 400 is fully positioned in the rack 200. FIG. 6B illustrates an embodiment of a beam forming communication system 600 with the networking device 300 fully positioned in the first device housing 210a and a plurality of the server devices 400 fully positioned in each of the second device housings 210b. In that embodiment, the front surfaces 402c of the server devices 400 are spaced apart from the rack entrance 204 of the rack 200 such that the antennas 404a and 404b on the antenna systems 404 do not extend past the rack entrance 204 of the rack 200. However, in some embodiments the extension of the antennas in the antenna system 404 past the rack entrance 204 will fall within the scope of the present disclosure.

As illustrated in FIG. 6C, a wireless communications may be provided between the networking device 300 and the server device(s) 400. In one example, the networking device 300 may be powered on, reset, booted up, and/or otherwise initiated. In a specific example, the server device 400e may then also be powered on, reset, booted up, and/or otherwise initiated. In response to being initiated, the wireless communication engine 406 in the server device 400e may operate to "pair" or otherwise establish a connection with the beam forming wireless communication engine 308 in the networking device 300. In a specific example, each of the server devices 400 may establish a relatively low speed wireless communication the networking device 300 using, for example, BLUETOOTH® wireless communication techniques, Near Field Communication techniques, and/or other short range communication techniques so that initial information may be exchanged between the server devices 400 and the networking device 300. While the establishment of such a connection between the server devices 400 and the networking device 300 of the present disclosure are not described in detail in the present disclosure, it should be sufficient to say that the wireless communication engine 406 in the server device 400e may utilize information in the wireless communication database 410 to determine that communication should be established with the antenna system 304 on the networking device 300 (e.g., based on a detected or determined position of the server device 400e in the rack 200), and then utilize that and/or other information in the wireless communication database 410 along with the wireless communication system 408 to begin communications 602a and 602b with the networking device 300 via that antenna system 304. The beam forming wireless communication engine 308 in the networking device 300 may then receive that information through the antenna system 304 using the beam forming wireless communication system 310, and utilize that information and/or other information in the wireless communication beam forming wireless communication database 312 to return the communications 602a and 602b with the server device 400e. Such initial communications may be used to exchange relative locations on the rack 200, minimum wireless signal characteristics for wireless communication signals, and/or any other information utilized in the method 500. The establishment of the connection between the other server devices 400 and the networking device 300 may be performed in substantially similar manners.

Figure 6D:
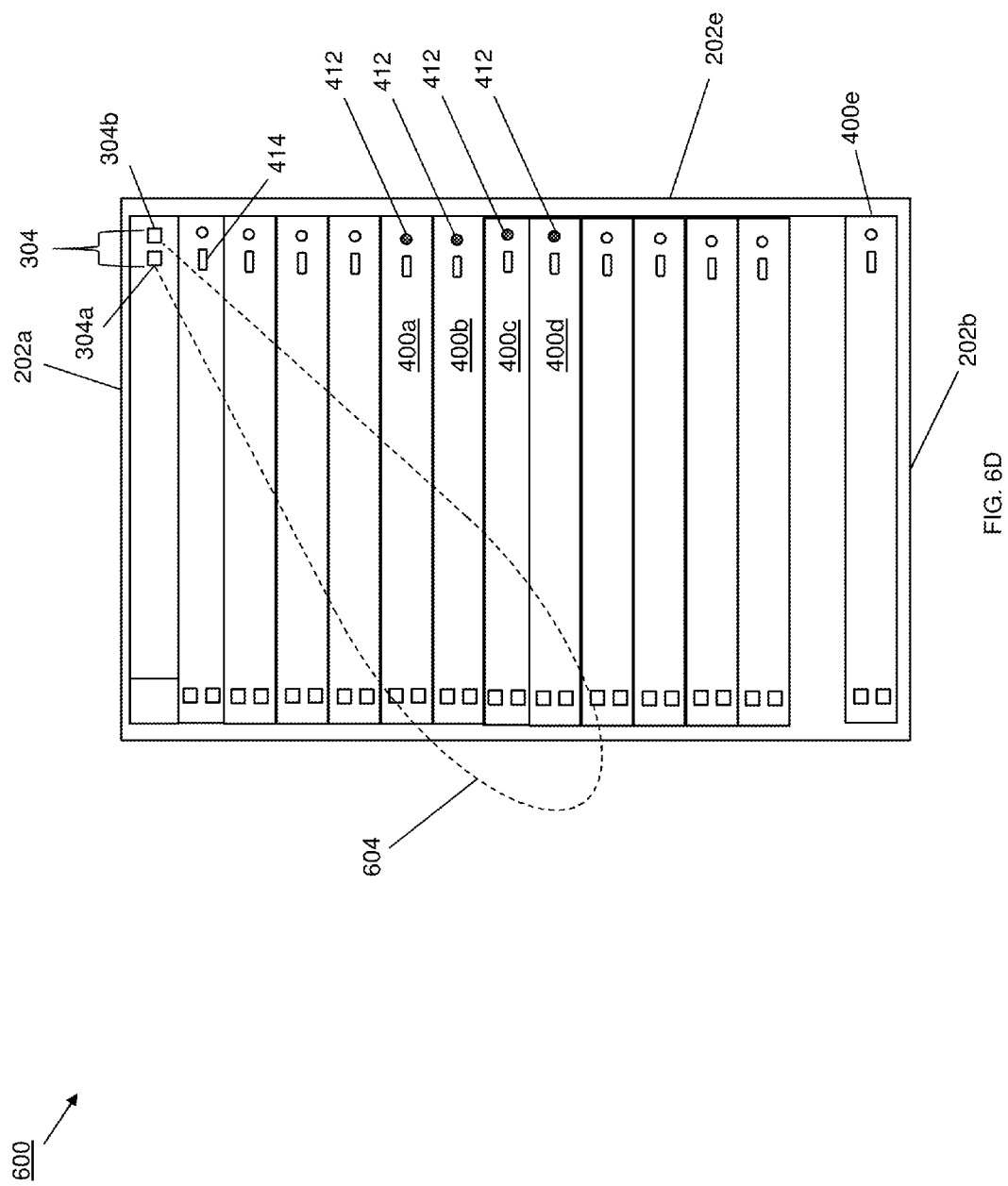
FIG. 6D is a front view illustrating an embodiment of a beam formed wireless communication path provided by the networking device to some of the server devices in the rack of FIG. 6C.

The method 500 then proceeds to block 504 where the beam forming wireless communication device provides wireless communication signals on one or more beam formed wireless communication paths. Referring now to FIG. 6D, the beam forming wireless communication engine 308 in the networking device 300 may use the beam forming wireless communication system 310 and the antenna system 304 to create a beam formed wireless communication path 604 that is directed towards a subset of the server devices 400 that are positioned in the rack 200 (e.g., the server devices 400a, 400b, 400c, and 400d in FIG. 6D). as discussed above, spatial filtering, beam forming, and/or other signal processing techniques that provide for directional signal transmission and/or reception may be utilized to create a beam formed wireless communication path that may transmit wireless signals having particular characteristics that are not satisfied by wireless signals transmitted outside of the beam formed wireless communication path. In the specific embodiment illustrated in FIG. 6D, the beam formed wireless communication path 604 is a single beam formed wireless communication path directed at only a subset of the server devices 400 that are positioned in the rack 200. However, as discussed below, the networking device 300 may direct more than one beam formed wireless communication path at different subsets of the server devices 400 that are positioned in the rack 200 while remaining within the scope of the present disclosure.

The method 500 then proceeds to block 506 where subsets of the computing devices receive wireless communication signals provided by the beam forming wireless communication device. In an embodiment, the wireless communication engines 406 in one or more of the server devices 400 in the rack 200 may receive wireless communication signals from the networking device 300 through their respective wireless communication systems 408 and antenna systems 404. As discussed above, one or more subsets of the server devices 400 in the rack 200 may receive wireless communication signals transmitted by the networking device 300 using the beam formed wireless communication path 604, while one or more subsets of the server devices 400 may receive wireless communication signals transmitted by the networking device 300 outside of the beam formed wireless communication path 604, and in some embodiments, one or more subsets of the server devices 400 may not receive wireless communication signals transmitted by the networking device 300. For example, in the embodiment illustrated in FIG. 6D, four of the server devices 400a, 400b, 400c, and 400d are receiving wireless communication signals transmitted by the networking device 300 in the beam formed wireless communication path 604.

The method 500 then proceeds to decision block 508 where it is determined whether received wireless communication signals satisfy one or more minimum wireless signal characteristics. In an embodiment, at decision block 508, the wireless communication engine 408 in each of the server devices 400 may determine at decision block 508 whether wireless signals received at block 506 satisfy one or more wireless signal characteristics that may be stored in the wireless communication database 410. For example, the wireless communication database 410 may store a plurality of wireless signal characteristic values such as, for example, wireless signal strength, wireless signal bandwidth, wireless signal quality, wireless signal security level, wireless channel, wireless transmit power, wireless receive sensitivity, wireless signal-to-noise ratio, wireless modulation, wireless signal reflections, and/or a variety of other wireless signal characteristics known in the art, and at decision block 508, the wireless communication engine 406 may compare the wireless communications signals received at block 506 to one of more of those wireless signal characteristics and determine whether the wireless communication signals satisfy (e.g., are greater than or equal to) those wireless signal characteristic values. In some embodiments, the wireless communication database 410 may include associations between wireless signal types, particular wireless communications, and/or other wireless signal identifiers and the one or more minimum wireless signal characteristics. For example, a high priority signal may be associated with minimum wireless signals speeds and/or security levels, and at decision block 508 the server device transmitting and/or receiving that high priority signal may determine whether that high priority signal is being transmitted and/or received at that minimum wireless signal speed and security levels. While a few examples have been provided, one of skill in the art in possession of the present disclosure will recognize that the determination of whether a received wireless signal satisfies any of a variety of wireless signal characteristics known in art will fall within the scope of the present disclosure.

If at decision block 508, it is determined that the received wireless communication signal satisfies minimum wireless signal characteristic(s), the method 500 proceeds to block 510 where one or more computing devices provide beam form receiving indications. In an embodiment, in response to determining that a received wireless communication signal satisfies minimum signal characteristics, the wireless communication engine 406 in a server device 400 may activate the beam form receiving indicator 412 in order to provide an indication that the minimum wireless signal characteristics are satisfied by the wireless signal that is being received by that server device 400. For example, FIG. 6D illustrates the beam form receiving indicators 412 on the four server devices 400a, 400b, 400c, and 400d in the rack 200 that have antenna systems 404 that are located within the beam form wireless communication path 604 providing an indication of such (e.g., illustrated by illuminated/black beam form receiving indicators 412 on the server devices 400a, 400b, 400c, and 400d as opposed to the non-illuminated/white beam form receiving indicators 412 on the other server devices 400 in the rack 200 illustrated in FIG. 6D.)

While FIG. 6D illustrates server devices 400 providing a single indication (e.g., illuminated/black beam form receiving indicators 412 or non-illuminated/white beam form receiving indicators 412) to indicate whether or not wireless communication signals transmitted with the networking device 300 satisfy minimum wireless signal characteristics, other indications may be provided. In an embodiment, the wireless communication engines 406 may activate beam form receiving indicators 412 to indicate a variety of information about the wireless communication signal that has been received. For example, a level of illumination of the beam form receiving indicator 412 may indicate the signal strength, quality, or other characteristic (i.e., relatively brighter illumination for higher strength/quality wireless signals and relatively lower illumination for lower strength/quality wireless signals; particular colors (e.g., green) for higher strength/quality wireless signals and particular colors (e.g., yellow or red) for lower strength/quality wireless signals; etc.). Furthermore, audio signals, information displays (e.g., a numerical indicator of wireless signal quality), and/or other indications may be provided at block 510 while remaining within the scope of the present disclosure.

The method 500 then proceeds to block 512 where computing devices communicate using the beam formed wireless communication path(s). In an embodiment, at block 512 the server device 400a, 400b, 400c, an/or 400d may communicate using the beam formed wireless communication path 604 provided by the networking device 300. In an embodiment, the wireless communication engine 406 in the server device 400a may use the beam formed wireless communication path 604 to send wireless communications to and receive wireless communications from the networking device 300, which may then transmit those wireless communications to the other server devices 400b, 400c, and/or 400d in the rack 200, to other networking devices in other racks in a datacenter, and/or to other wireless communication devices in a datacenter in order to allow the server device 400a in the rack 200 to communication with other server devices in the rack 200 as well as other computing devices in a datacenter.

If at decision block 508, it is determined that the wireless communication signal received by a server device does not satisfy minimum wireless signal characteristic(s), the method 500 proceeds to decision block 514 where it is determined whether a modification should be made to the beam formed wireless communication path. The beam formed wireless communication path modification determination at decision block 514 may be made using a variety of techniques, only a few of which are discussed below. In an embodiment, a user/administrator may manually request a beam formed wireless communication path modification.

For example, with reference to FIG. 6D, a user/administrator may determine that one or more of the server device(s) 400 in the rack 200 that is not receiving the wireless communication signals in the beam formed wireless communication path 604 (e.g., one of the server devices 400 with the non-illuminated/white beam form receiving indicators 412) should receive wireless signals with higher wireless signal characteristics (e.g., a server device that is being configured to transmit high priority signals with the networking device 300). The user/administrator may make such a determination by viewing a non-activated beam form receiving indicator 412 (or activation that indicates a non-optimal wireless communication signal), and may then actuate the beam form trainer 414 on that server device 400 to cause that server device 400 to send a request to the networking device 300 to modify the beam form wireless communication path 604.

In an embodiment, server device(s) 400 may automatically request a beam formed wireless communication path modification. For example, with reference to FIG. 6D, one or more server device(s) 400 in the rack 200 that are not receiving the wireless communication signals in the beam formed wireless communication path 604 (e.g., one of the server devices 400 with the non-illuminated/white beam form receiving indicators 412) may determine that it should receive wireless signals with higher wireless signal characteristics. In a specific example, that server device 400 may determine that it is transmitting wireless communication signals that are associated with required minimum signal characteristics in the wireless communication database 410 and, in response to determining that those wireless minimum signal characteristics are not being satisfied, may automatically send a request to the networking device 300 to modify the beam form wireless communication path 604. As such, server devices 400 associated with high priority applications may be configured to ensure they are enabled to transmit the wireless communications with the networking device 300 that enable those high priority applications.

In an embodiment, the request to modify the beam formed wireless communication path may include a variety of information. For example, such a request from a server device 400 may include the identity of that server device, a relatively location of that server device in the rack 200 and/or with respect to the networking device 300, a target device that that server device would like to communicate with, and/or any other information that would enable the modification of the beam formed wireless communication path as discussed below. While a few examples have been provided, one of skill in the art in possession of the present disclosure will recognize that a variety of situations may make it desirable to ensure minimum signal characteristics for wireless communication signals between a server device and a networking device, and any technique for making the determination to modify the beam formed wireless communication path to ensure such minimum signal characteristics for those wireless communication signals, as well as an information necessary to perform that modification, is envisioned as falling within the scope of the present disclosure.

The method 500 then proceeds to block 516 where the beam forming wireless communication device provides wireless communication signals on a different beam formed wireless communication path. In an embodiment, the beam forming wireless communication engine 308 in the networking device 300 may determine that that a beam formed wireless communication path modification should be performed (e.g., in response to a request received from one of the server devices 400 in the rack 200) and, in response, provide wireless communications signals on one or more beam formed wireless communication paths that are different than the beam formed wireless communication path(s) provided at block 504. For example, with reference to FIG. 6E, one or more of the server devices 400e, 400f, and 400g may send a request to the networking device 400 to modify the beam formed wireless communication path 604 illustrated in FIG. 6D and, in response, the beam forming wireless communication engine 406 may modify the beam formed wireless communication path 604 to provide a beam formed wireless communication path 606 illustrated in FIG. 6E. Information included in the request for the server device 400 such as, for example, the relative location of that server 400 in the rack 200 and/or with respect to the networking device 300 may be utilized to determine the directionality of the beam formed wireless communication path 606. As can be seen in FIG. 6E, the antenna systems 404 on the server devices 400e, 400f, and 400g receive signals provided using the beam formed wireless communication path 606. Following block 516, the method 500 may then return to block 506 where subsets of the computing devices (e.g., the server devices 400e, 400f, and 400g) receive wireless signals provided on the beam formed wireless communication path 606, and then continue through blocks 508, 510, 512, 514, and/or 516 as discussed above and, as such, the beam form receiving indicator 412 on each of the server devices 400e, 400f, and 400g may be activated (e.g., as illustrated by the illuminated/black beam form indicators 412).

Figure 6F:
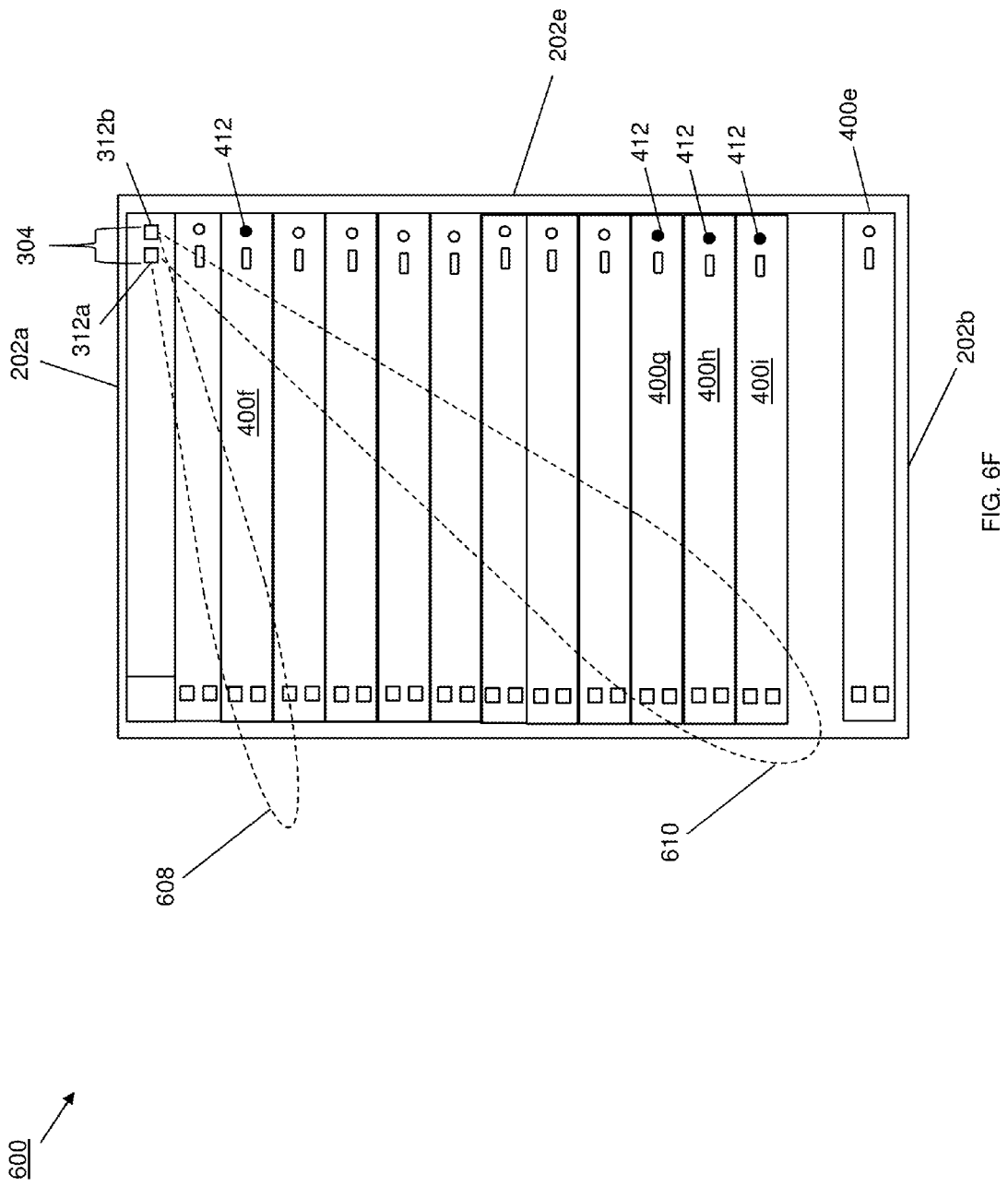
FIG. 6F is a front view illustrating an embodiment of beam formed wireless communication paths provided by the networking device to some of the server devices in the rack of FIG. 6C.

In another example, with reference to FIG. 6F, the server devices 400b and one of more of the server devices 400g, 400h, and 400i may send a request to the networking device 400 to modify the beam formed wireless communication path 604 illustrated in FIG. 6D (or the beam formed wireless communication path 606 illustrated in FIG. 6E) similarly as discussed above. In response, the beam forming wireless communication engine 406 may modify the beam formed wireless communication path 604 (or 606) to provide a plurality of beam formed wireless communication paths 608 and 610 illustrated in FIG. 6F. As can be seen in FIG. 6F, the antenna systems 404 on the server devices 400f, 400h, 400i, and 400j receive signals provided using the beam formed wireless communication paths 608 and 610. Following block 516, the method 500 may then return to block 506 where subsets of the computing devices (e.g., the server devices 400f, 400g, 400h, and 400i) receive wireless signals provided on the beam formed wireless communication paths 608 and 610, and then continue through blocks 508, 510, 512, 514, and/or 516 as discussed above and, as such, the beam form receiving indicator 412 on each of the server devices 400f, 400g, 400h, and 400i may be activated (e.g., as illustrated by the illuminated/black beam form indicators 412).

Figure 7A:
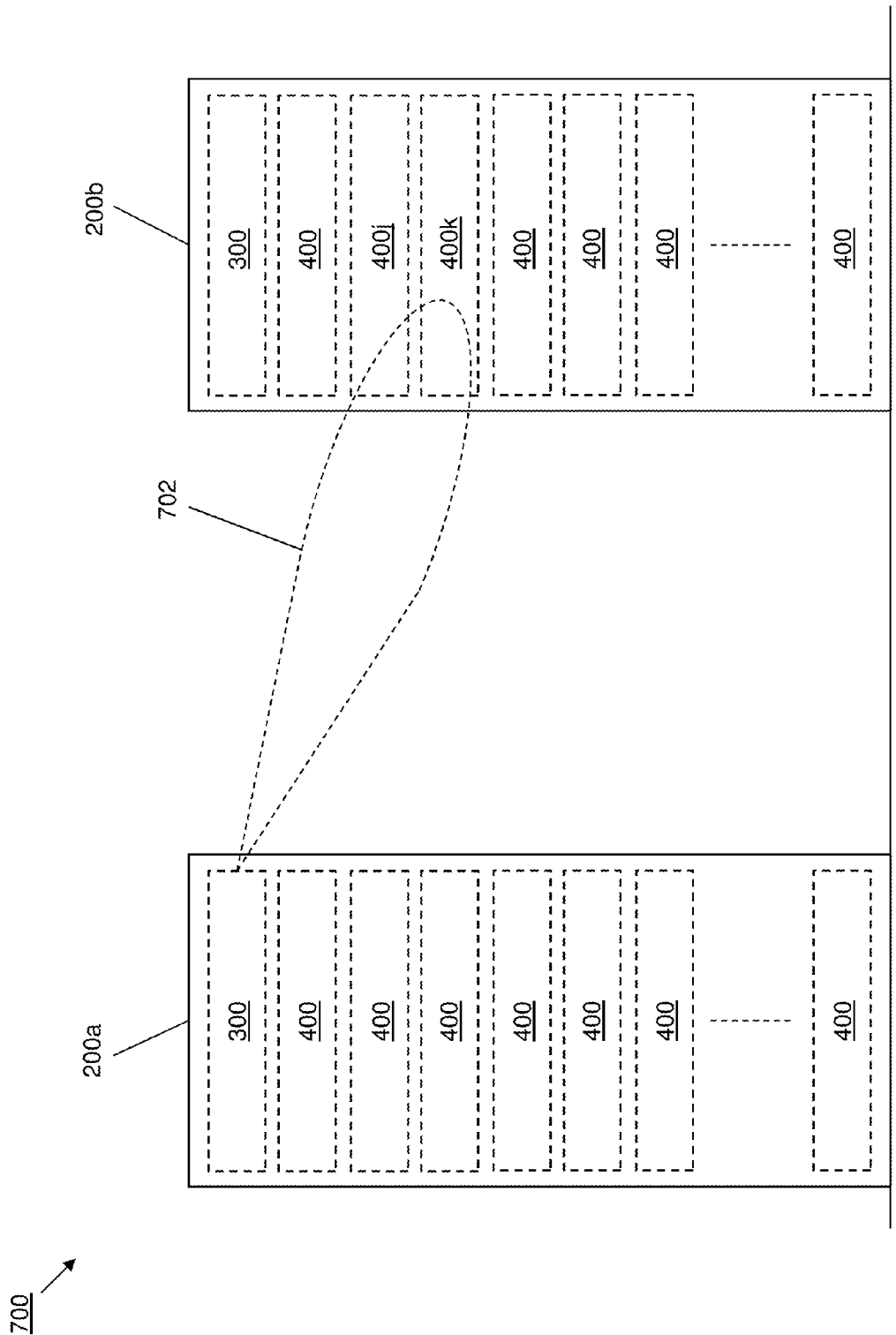
FIG. 7A is a side view illustrating an embodiment of a beam formed wireless communication path provided by the networking device of FIGS. 3A and 3B in a first rack to some of the server devices of FIGS. 4A and 4B in a second rack.
Figure 7B:
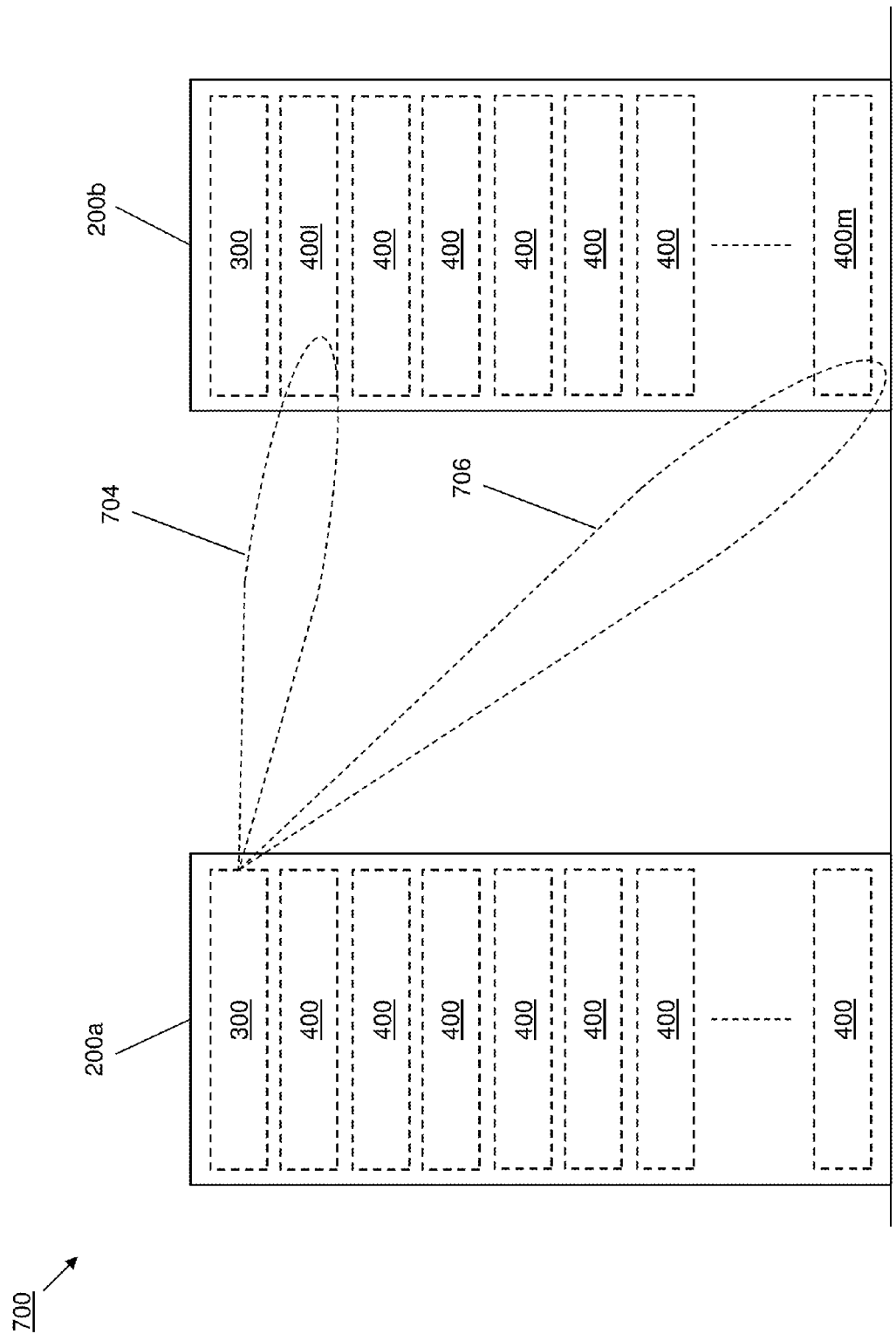
FIG. 7B is a side view illustrating an embodiment of beam formed wireless communication paths provided by the networking device of FIGS. 3A and 3B in a first rack to some of the server devices of FIGS. 4A and 4B in a second rack.

While the embodiments and examples of the method 500 discussed above are directed to the modification and use of beam formed wireless communication paths for networking device/server device communication within a rack, the beam formed wireless communication paths may be utilized for communication between devices outside of a rack as well. For example, FIG. 7A illustrates a plurality of racks 200a and 200b which are substantially similar to the rack 200 discussed above, and which are positioned in a spaced apart orientation from each other (e.g., in different aisles in a datacenter). Similarly as above, each of the racks 200a and 200b include a networking device 300 and a plurality of server devices 400. As illustrated in FIG. 7A, the networking device 300 in the rack 200a may operate according to the method 500 to provide a beam formed wireless communication path 702 substantially as described above to transmit wireless communication signals having minimum wireless signal characteristics to some of the server devices 400j and 400k in the rack 200b. As further illustrated in FIG. 7B, the networking device 300 in the rack 200a may operate according to the method 500 discussed above to modified the beam formed wireless communication path 702 to provide a plurality of beam formed wireless communication paths 704 and 706 to transmit wireless communication signals having minimum wireless signal characteristics to others of the server devices 400l and 400m in the rack 200b.

Thus, systems and methods have been described that use beam forming techniques to provide beam formed wireless communication paths that transmit wireless communication signals having minimum wireless signal characteristics, and that include computing devices that receive the wireless communication signals with the minimum wireless signal characteristics over the beam formed wireless communication paths provide a beam form receiving indication in response. Furthermore, computing devices that receive wireless communication signals outside of the beam formed wireless communication path such that those wireless communication signals do not satisfy minimum wireless signal characteristics (or that do not receive the wireless communication signals at all) may indicate as such and as a result, a request may be sent to modify the beam formed wireless communication path such that those computing devices may receive the wireless communication signals that satisfy the minimum wireless signal characteristics. One of skill in the art in possession of the present disclosure will recognize that the systems described herein may perform the methods described herein repeatedly such that beam formed wireless communication paths are dynamically modified repeatedly to ensure communication between several computing devices and a beam forming wireless communication device such that minimum wireless signal characteristics are satisfied. In specific embodiments, the systems and methods of the present disclosure may be implemented in a datacenter to negate the need for cabling between server devices and networking devices in a rack, or between such devices in different racks.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A beam forming communication system, comprising:
a plurality of computing devices; and
a beam forming wireless communication device that is configured to:
provide wireless communication signals in a first beam formed wireless communication path such that a first subset of the plurality of computing devices receive the wireless communication signals at or above minimum wireless signal characteristics, and a second subset of the plurality of computing devices receive the wireless communication signals below the minimum wireless signal characteristics;
receive a request to modify the first beam formed wireless communication path based on at least one of the second subset of the plurality of computing devices that are receiving the wireless communication signals below the minimum wireless signal characteristics; and
automatically provide, in response to receiving the request to modify the first beam formed wireless communication path, the wireless communication signals in a second beam formed wireless communication path that is different than the first beam formed wireless communication path such that the at least one of the second subset of the plurality of computing devices receives the wireless communication signals at or above minimum wireless signal characteristics.

2. The beam forming communication system of claim 1, wherein the beam forming wireless communication device is configured to modify the first beam formed wireless communication path by:
providing the wireless communication signals in the second beam formed wireless communication path at the same time as providing the wireless communication signals in the first beam formed wireless communication path.

3. The beam forming communication system of claim 1, wherein the beam forming wireless communication device is configured to modify the first beam formed wireless communication path by:
adjusting the directionality of the first beam formed wireless communication path to provide the second beam formed wireless communication path.

4. The beam forming communication system of claim 1, wherein the minimum wireless signal characteristics include at least one of a minimum wireless signal strength, a minimum wireless signal bandwidth, and a minimum wireless signal security level.

5. The beam forming communication system of claim 1, wherein the beam forming wireless communication device is configured to:
determine, using location information included in the request to modify the first beam formed wireless communication path, a location of the at least one of the second subset of the plurality of computing devices that are receiving the wireless communication signals below the minimum wireless signal characteristics, wherein the providing the wireless communication signals in the second beam formed wireless communication path is based on the location of the at least one of the second subset of the plurality of computing devices.

6. The beam forming communication system of claim 1, wherein the beam forming wireless communication engine is configured to:
determine, using target device information included in the request to modify the first beam formed wireless communication path, a target device for communicating with the at least one of the second subset of the plurality of computing devices that are receiving the wireless communication signals below the minimum wireless signal characteristics, wherein the providing the wireless communication signals in the second beam formed wireless communication path is based on the target device.

7. The beam forming communication system of claim 1, further comprising:
a chassis, wherein the plurality of computing devices are positioned in the chassis.

8. An information handling system (IHS), comprising:
a beam forming wireless communication subsystem;
a processing system that is coupled to the beam forming wireless communication subsystem; and
a memory system that is coupled to the processing system and that includes instructions that, when executed by the processing system, cause the processing system to provide a beam forming wireless communication engine that is configured to:

provide wireless communication signals in a first beam formed wireless communication path such that a first subset of a plurality of computing devices receive the wireless communication signals at or above minimum wireless signal characteristics, and a second subset of the plurality of computing devices receive the wireless communication signals below the minimum wireless signal characteristics;

receive a request to modify the first beam formed wireless communication path based on at least one of the second subset of the plurality of computing devices that are receiving the wireless communication signals below the minimum wireless signal characteristics; and automatically provide, in response to receiving the request to modify the first beam formed wireless communication path, the wireless communication signals in a second beam formed wireless communication path that is different than the first beam formed wireless communication path such that the at least one of the second subset of the plurality of computing devices receives the wireless communication signals at or above minimum wireless signal characteristics.

9. The IHS of claim 8, wherein the beam forming wireless communication engine is configured to modify the first beam formed wireless communication path by:

providing the wireless communication signals in the second beam formed wireless communication path at the same time as providing the wireless communication signals in the first beam formed wireless communication path.

10. The IHS of claim 8, wherein the beam forming wireless communication engine is configured to modify the first beam formed wireless communication path by:

adjusting the directionality of the first beam formed wireless communication path to provide the second beam formed wireless communication path.

11. The IHS of claim 8, wherein the minimum wireless signal characteristics include at least one of a minimum wireless signal strength, a minimum wireless signal bandwidth, and a minimum wireless signal security level.

12. The IHS of claim 8, wherein the beam forming wireless communication engine is configured to:

determine, using location information included in the request to modify the first beam formed wireless communication path, a location of the at least one of the second subset of the plurality of computing devices that are receiving the wireless communication signals below the minimum wireless signal characteristics, wherein the providing the wireless communication signals in the second beam formed wireless communication path is based on the location of the at least one of the second subset of the plurality of computing devices.

13. The IHS of claim 8, wherein the beam forming wireless communication engine is configured to:

determine, using target device information included the request to modify the first beam formed wireless communication path, a target device for communicating with the at least one of the second subset of the plurality of computing devices that are receiving the wireless communication signals below the minimum wireless signal characteristics, wherein the providing the wireless communication signals in the second beam formed wireless communication path is based on the target device.

14. A method for providing beam forming communications, comprising:

providing, by a beam forming wireless communication device, wireless communication signals in a first beam formed wireless communication path such that a first subset of a plurality of computing devices receive the wireless communication signals at or above minimum wireless signal characteristics, and a second subset of the plurality of computing devices receive the wireless communication signals below the minimum wireless signal characteristics;

receiving, by the beam forming wireless communication device, a request to modify the first beam formed wireless communication path based on at least one of the second subset of the plurality of computing devices that are receiving the wireless communication signals below the minimum wireless signal characteristics; and automatically providing, by the beam forming wireless communication device in response to receiving the request to modify the first beam formed wireless communication path, the wireless communication signals in a second beam formed wireless communication path that is different than the first beam formed wireless communication path such that the at least one of the second subset of the plurality of computing devices receives the wireless communication signals at or above minimum wireless signal characteristics.

15. The method of claim 14, wherein the first beam formed wireless communication path is modified by:

providing, by the beam forming wireless communication device, the wireless communication signals in the second beam formed wireless communication path at the same time as providing the wireless communication signals in the first beam formed wireless communication path.

16. The method of claim 14, wherein the first beam formed wireless communication path is modified by:

adjusting, by the beam forming wireless communication device, the directionality of the first beam formed wireless communication path to provide the second beam formed wireless communication path.

17. The method of claim 14, wherein the minimum wireless signal characteristics include at least one of a minimum wireless signal strength, a minimum wireless signal bandwidth, and a minimum wireless signal security level.

18. The method of claim 14, further comprising:

determining, by the beam forming wireless communication device using location information included in the request to modify the first beam formed wireless communication path, a location of the at least one of the second subset of the plurality of computing devices that are receiving the wireless communication signals below the minimum wireless signal characteristics, wherein the providing the wireless communication signals in the second beam formed wireless communication path is based on the location of the at least one of the second subset of the plurality of computing devices.

19. The method of claim 14, wherein the beam forming wireless communication engine is configured to:

determining, by the beam forming wireless communication device using target device information included in the request to modify the first beam formed wireless communication path, a target device for communicating with the at least one of the second subset of the plurality of computing devices that are receiving the wireless communication signals below the minimum wireless signal characteristics, wherein the providing the wireless communication signals in the second beam formed wireless communication path is based on the target device.

20. The method of claim 14, wherein the plurality of computing devices are positioned in a chassis.

\* \* \* \* \*